United States Patent [19]
Oyabe et al.

[11] Patent Number: 5,811,996
[45] Date of Patent: Sep. 22, 1998

[54] GATE DRIVE CIRCUIT HAVING REDUCED CURRENT-CONSUMPTION AND RAPID INDUCTIVE ENERGY DISSIPATION

[75] Inventors: Kazunori Oyabe; Tatsuhiko Fujihira; Kazuhiko Yoshida; Yukio Yano, all of Nagano, Japan

[73] Assignee: Fuji Electric Co., Ltd., Kawasaki, Japan

[21] Appl. No.: 767,952

[22] Filed: Dec. 17, 1996

Related U.S. Application Data

[63] Continuation of Ser. No. 415,946, Mar. 31, 1995, abandoned.

[30] Foreign Application Priority Data

Mar. 31, 1994 [JP] Japan .................................. 6-061836

[51] Int. Cl.⁶ ...................................................... H03K 3/00
[52] U.S. Cl. .......................... 327/110; 327/427; 327/434; 327/544
[58] Field of Search ............................ 327/108–112, 544, 327/534, 537, 314, 319, 320, 333, 538–543, 427, 434

[56] References Cited

U.S. PATENT DOCUMENTS

| 4,313,079 | 1/1982 | Lee ........................................... 327/581 |
| 4,692,689 | 9/1987 | Takemae ................................. 327/427 |
| 5,138,200 | 8/1992 | Barsanti et al. ......................... 327/589 |

FOREIGN PATENT DOCUMENTS

| 0319047 | 6/1989 | European Pat. Off. . |
| C572706A1 | 12/1993 | European Pat. Off. . |
| 2692415 | 12/1993 | France . |

*Primary Examiner*—Timothy P. Callahan
*Assistant Examiner*—Kenneth B. Wells
*Attorney, Agent, or Firm*—Morrison Law Firm

[57] ABSTRACT

A gate drive circuit device for a voltage-driven semiconductor element reduces the time to dissipate inductively stored electromagnetic energy and reduces current consumption by using cyclically charged capacitative storage to produce a control signal that is about twice the supply voltage. This permits full-ON dissipation of the stored energy after the circuit cuts off power to the inductive element. In one embodiment, the dissipation is chiefly in a voltage-regulator diode connected to limit the voltage appearing across a transistor. In another embodiment, a voltage regulator diode permits a transistor to operate in the full-on condition, while limiting the voltage across it to a value below its withstand voltage, whereby a maximum power dissipation current flows in the transistor. In a further embodiment a gate drive signal generator eliminates a voltage regulator diode from the conventional gate drive circuit device. Instead, this embodiment substitutes switching devices both on the power supply side and the reference potential (ground) side. Both switching devices include a switch and an operating section that controls switching operation. The two operating sections receive an externally generated command signal for timing the ON/OFF operation of the switches. The control technique permits both the switching and operating sections to be fabricated integrally as an integrated circuit.

9 Claims, 13 Drawing Sheets

GATE DRIVE CIRCUIT HAVING REDUCED CURRENT-CONSUMPTION AND RAPID INDUCTIVE ENERGY DISSIPATION

This is a continuation of application Ser. No. 08/415,946 filed Mar. 31, 1995, now abandoned.

BACKGROUND

The present invention relates to a gate drive circuit device for applying a gate drive signal to a gate of a voltage-driven semiconductor element and, more particularly, to a drive circuit device suitable for driving a voltage-driven semiconductor element used as an inductive load.

Electronic equipment using a power semiconductor element has long been used as an electric apparatus for controlling electric equipment having an inductive component such as an electromagnetic coil or an electric motor. Recent developments and improvements in semiconductor techniques have made it practical to increase the use of such electronic equipment. One example of such electronic equipment including an apparatus which performs ON/OFF driving of electromagnetic coil using a voltage-driven semiconductor element as a power semiconductor element is shown in FIG. 14.

Referring to FIG. 14, a conventional gate drive circuit device for a voltage-driven semiconductor element includes a gate drive circuit device 9. A power supply terminal 913 receives a supply voltage from a power supply 9A. A reference potential terminal 914 receives a reference voltage which is nominally referred to as ground 9B. Thus, the gate drive circuit device 9 receives a supply voltage Vcc between the power supply 9A and ground 9B. The gate drive circuit device 9 also has an input terminal 911 for command signal 11a, and an output terminal 912 for outputting a gate drive signal 12a corresponding to the command signal 11a to a gate of an n-channel enhancement MOSFET (hereinafter referred to as "nEMOS") 7 which is part of a main voltage-driven semiconductor element. The command signal 11a is a binary signal having either a high level (hereinafter referred to as "H") and a low level (hereinafter referred to as "L"). The nEMOS 7 is a semiconductor element which is turned ON when the gate drive signal 12a is "H" and turned OFF when it is "L".

The gate drive circuit device 9 includes a logic circuit section 91, an oscillator circuit section 92, an n-channel depletion MOSFET (hereinafter referred to as "nDMOS") 931, an nEMOS 932, a p-channel enhancement MOSFET (hereinafter referred to as "pEMOS") 941, an nEMOS 952, an nDMOS 951, an nEMOS 952, a pEMOS 961, an NEMOS 962, a capacitor 97, diodes 981, 982 and 983, a voltage regulator diode 99, and a constant-voltage power supply section 991. The pEMOSs 941 and 961 are connected to the power supply 9A at their sources.

The constant-voltage power supply section 991 receives a supply voltage Vcc, which is equal to the supply voltage to the gate drive circuit device 9, that is a voltage between the power supply 9A and ground 9B. Constant-voltage power supply section 991 supplies a stabilized constant auxiliary supply voltage VDD to inputs of oscillator circuit section 99 and logic circuit section 91.

The logic circuit section 91 receives the command signal 11a, outputs a signal 91a having the same level as that of the command signal 11a from an enable (E) terminal thereof and outputs a signal 91b having an inverse level of the command signal 11a from a disable (EB) terminal thereof.

The oscillator circuit section 92 receives the signal 92a and outputs a signal 92a which alternately repeats "H" and "L" in a period shorter than the shortest duration of "H" or "L" of the command signal 11a from one output terminal. In addition, oscillator circuit section 92 produces a signal 92b which is the inverse of the signal 92a. That is, when the signal 92a is "L", the signal 92b is "H", and vice versa. The oscillator circuit section 92 remains quiescent, not outputting either of the signals 92a and 92b, when the signal 91a is "H".

The nDMOS's 931 and 951 connected in the manner shown in FIG. 14, as is well known, suppress currents flowing into the nDMOS's 931 and 951 to their saturation values. That is, a substantially constant current therein prevents excess current from flowing into circuit elements connected to the nDMOS's 931 and 951, when a large voltage is applied between their drain and source. The nDMOS 931 and 951 operate like a resistor element when a voltage between their drain and source is small.

When the command signal 11a is "L", the nEMOS 952 receives the signal 91b "H" and is then turned ON. As a result, the potential at a node between the source of the nDMOS 951 and the drain of the nEMOS 952 is lowered nearly to the potential of ground 9B, and the pEMOS 961 turns ON. The NEMOS 962 receives the signal 91a "L" and is turned OFF when, the command signal 11a is "L". As a result, when the command signal 11a is "L", the voltage of the power supply 9A is output from the output terminal 912 through the pEMOS 961 and the diode 981.

The nEMOS 932 is turned ON by the signal 92b "H". As a result, the potential at the node between the source of the nDMOS 931 and the drain of the nEMOS 932 is lowered nearly to the potential of ground 9B so that the pEMOS 941 turns ON. The nEMOS 942 receives the signal 92a "L" and is turned OFF when the signal 92b is "H". With the above operation, when the signal 92b is "H", the potential of the power supply 9A is applied to one terminal of the capacitor 97, which is connected to the pEMOS 931, through the pEMOS 941. When the signal 92b is "L", the nEMOS 932 is turned OFF. As a result, the potential at the node between the source of the nDMOS 931 and the drain of the NEMOS 932 is raised close to the potential of the power supply 9A, thereby turning the pEMOS 941 OFF. The nEMOS 942 receives the signal 92a "H" and is then turned ON when the signal 92b is "L". With the above operation, when the signal 92b is "L", the potential at the terminal of the capacitor 97, which is connected to the pEMOS 941, approaches the potential of ground 9B. In other words, the terminal of the capacitor 97 connected to the pEMOS 941 is alternately brought to a potential near that of the power supply 9A and to a potential close to that of ground 9B in step with the signals 92a and 92b from the oscillator circuit section 92.

In addition, when the command signal 11a is "L", the pEMOS 961 is turned ON as described above and the other terminal of the capacitor 97, which is connected to the diode 982, is raised to a potential close to that of the power supply 9A. Hence, when the command signal 11a is "L" and the signal 92b is "L", a voltage close to the supply voltage Vcc is applied across the capacitor 97. The capacitor 97 is thus charged to a voltage close to Vcc. When the command signal 11a is "L" and the signal 92b is "H", the capacitor 97 holds the charges stored therein, as a result of which the voltage across the capacitor 97 remains at a value corresponding to the amount of charge held by the capacitor 97. In this manner, charges are successively stored in the capacitor 97 as the signal 92a cycles between "H" and "L", whereby the voltage across the capacitor 97 rises and remains close to the supply voltage Vcc. When the signal 92b is "H", the terminal of the capacitor 97, which is connected to the pEMOS 941, is supplied with the voltage of the power supply 9A through the pEMOS 941 as described above, and the voltage at the terminal of the capacitor 97, which is connected to the diode 982, receives a sum of the voltage close to the supply voltage Vcc and the voltage across the capacitor 97, which corresponds to the amount of charge held by the capacitor 97. The sum may be about twice the voltage of the power supply 9A. A voltage due to the potential difference between the terminal of the capacitor 97, which is connected to the diode 982, and ground 9B is output from the output terminal 912 as a value of the gate drive signal 12a "H" during a period when the command signal 11a is "L".

The nEMOS 7 is turned ON upon receiving the gate drive signal 12a "H" from the gate thereof. An electromagnetic coil 79 is connected between an output terminal 7a connected to the source of the NEMOS 7 and ground 9B. Electromagnetic coil 79 is a load of the nEMOS 7. When the nEMOS 7 is ON, the electromagnetic coil 79 receives a voltage close to the supply voltage Vcc so that a current $I_L$ flows through the nEMOS 7. This energizes electromagnetic coil 79.

When the command signal 11a is changed to "H", the signal 91a output from the logic circuit section 91 is changed to "H", and the signal 91b is changed to "L". Since, upon receiving the signal 91a "H", the oscillator circuit section 92 stops outputting the signals 92a and 92b, charging of the capacitor 97 is stopped. Also, upon receiving the signal 91b "L", the nEMOS 952 is turned OFF. As a result, since the potential at the node between the source of the nDMOS 951 and the drain of the nEMOS 952 rises to a potential close to that of the power supply 9A, the pEMOS 961 with its gate connected to the node is turned OFF. At the same time the nEMOS 962 is turned OFF upon receiving the signal 91a "H", and then the potential of the output terminal 912 approaches the potential of ground 9B. As a result, when the command signal 11a changes to "H", the potential at the output terminal 912 approaches ground 9B. The potential from the output terminal 912 is equal to the value when the gate drive signal 12a is "L" while the command signal 11a is "H". A parasitic diode 962a across the source/drain terminals of the nEMOS 962 is connected as shown in FIG. 14. Parasitic diode 962a is created due to the method by which the device is manufactured. The parasitic diode 962a would permit current to flow toward the gate of the nEMOS 7, even when a slight above-ground voltage exists. The breakdown voltage of the voltage regulator diode 99, in series with the nEMOS 75, prevents this undesired flow of current.

The nEMOS 7 is turned OFF immediately after its gate receives the "L" of the gate drive signal 12a. The NEMOS 7 then begins to interrupt the current $I_L$ flowing through the electromagnetic coil 79. However, since the electromagnetic coil has an inductance L, a counter electromotive force equal to $(-L \times dI_L/dt)$ is developed. The direction of the counter electromotive force produces a circulating current Ic in a path depicted in heavy line including the electromagnetic coil 79 as shown in FIG. 14. The counter electromotive force applies a voltage between the gate of the nEMOS 7 and the source which is the other main electrode thereof. A voltage-driven power semiconductor element with a source serving as an output terminal generally has a following withstand voltage value between the gate and the source or the drain as one main electrode. That is, in the general nEMOS, a withstand voltage between the gate and drain thereof has a value exceeding an element withstand value which is the withstand voltage between the drain and source thereof. On the other hand, a withstand voltage between the gate and source is ten volts or so at most. This gate/source withstand voltage is smaller than the withstand voltage of the power semiconductor element. Hence, for the purpose of preventing breakdown between the gate and source due to the counter electromotive force, the voltage applied between the gate and source of the nEMOS 7 at the time of generation of the counter electromotive force must be limited to a value below its withstand voltage. The nEMOS 75 provides this voltage suppression. The voltage regulator diodes 75a and 75b, connected back to back between the gate and source of the nEMOS 75, prevent breakdown between the gate and source of the NEMOS 75.

A drain of nEMOS 75 is connected to the gate of the nEMOS 7. A source of NEMOS 75 is connected to the source of the nEMOS 7. A gate of nEMOS 75 is connected to ground 9B. Therefore, when the potential of the source of the nEMOS 7, that is, the potential of the output terminal 7a, is reduced below ground 9B by the counter electromotive force, the NEMOS 75 turns ON, thereby connecting together the gate and source of the NEMOS 7. As a result, the counter electromotive force is prevented from producing breakdown between the gate and source of the nEMOS 7.

With the presence of the nEMOS 75, the counter electromotive force, which is developed in the electromagnetic coil 79 when the command signal 11a switched to "H", is applied to the voltage regulator diode 99 through ground 9B with a polarity directed from its cathode to its anode because the nEMOS 962 is ON in this state. The counter electromotive force readily exceeds the breakdown voltage of the voltage regulator diode 99. Therefore, the circulating current Ic produced by the counter electromotive force circulates in a path which passes through the electromagnetic coil 79, ground 9B, the voltage regulator diode 99 and the parasitic diode 962a of the nEMOS 962 in the stated order, and returns to the electromagnetic coil 79 via the nEMOS 75.

The circulating current Ic flowing in this path develops a voltage in the resistance between the drain and source of the NEMOS 962. This voltage is applied between the gate and source of the nEMOS 7, whereby the NEMOS 7 is conductive in a half-ON state regardless of the fact that the gate drive signal 12a is "L". As a result, a sustained current $I_{off}$ flows into the electromagnetic coil 79 from the power supply 9A through nEMOS 7 in a direction in which the current $I_L$ flows. In the electromagnetic coil 79, electromagnetic energy $W_L [=(\frac{1}{2})LI^2]$ is stored during the period when the command signal 11a is "L". Stored electromagnetic energy is dissipated in the nEMOS 7 as an electric power which is equal to a product of the sustained current Ioff and a voltage between the drain and source of the nEMOS 7 in the half-ON state. Consequently, the electromagnetic energy $W_L$ in electromagnetic coil 79 is dissipated through the nEMOS 7 so that electromagnetic coil 79 can be deenergized.

The above-mentioned conventional gate drive circuit device 9 is constituted on the basis of an electronic circuit generally called a charging pump, with the voltage regulator diode 99 added thereto. The charging pump outputs a voltage twice the supply voltage Vcc from the terminal of the capacitor 97 which is connected to the diode 982. The gate drive circuit device thus supplies the gate drive signal 12a at a level required by the power semiconductor element which is a main semiconductor element of the voltage-driven type even though the supply voltage Vcc is relatively low. In addition, the gate drive circuit device 9 has the advantage that the gate drive circuit device having the above functions and the power semiconductor element driven by the gate drive circuit device can be fabricated integrally on the same semiconductor substrate to form a so-called one-chip power semiconductor element which can be readily manufactured by conventional semiconductor manufacturing techniques, Many other types of IGBT devices, besides MOSFET devices are known for driving voltage-driven type semiconductor devices.

Conventional devices are known using a p-channel power semiconductor element rather than the n-channel power semiconductor element for the main semiconductor element of the voltage-driven semiconductor device which is driven by the gate drive circuit device.

The above conventional gate drive circuit device for a voltage-driven semiconductor element is capable of controlling electric equipment, even though the equipment has an inductive component, by ON/OFF-driving the voltage-driven power semiconductor element using that circuit device. However, it has been ascertained that such a conventional gate drive circuit device suffers from the following problems.

(1) When the load of the power semiconductor element is inductive with an inductance L, the electromagnetic energy $W_L$ stored in the electric equipment must be nullified in order to turn OFF the power semiconductor element. In such a situation, as was described in association with the conventional device, the electromagnetic energy is generally dissipated in a section of the power semiconductor element. The time required for nullifing the electromagnetic energy $W_L$ stored in the electric equipment is satisfactorily shortened by increasing the rate at which energy is absorbed by the power semiconductor element per unit time. The electromagnetic energy absorbed by the power semiconductor element per unit time relates to a product of a drain-source voltage drop in the power semiconductor element and the current $I_{off}$ from the drain to the source at that time. The absorption, or dissipation, of the energy $W_L$ in the prior art is performed by the power semiconductor element in the half-ON state. The drain-source voltage of the power semiconductor element in the half-ON state is several tens to 50 percent of the withstand voltage of the power semiconductor element, which is remarkably lower than its withstand voltage. Hence, the energy absorption capability of the power semiconductor element is not utilized to its maximum. Consequently, a long time is required for absorbing the electromagnetic energy $W_L$ stored in the inductive electric equipment by the power semiconductor element during turning OFF the power semiconductor element. This has limited the high-speed operation of the electric equipment.

(2) In forming the gate drive circuit device 9 integrally with the semiconductor substrate, an insulating film formed on the semiconductor substrate by conventional semiconductor fabrication techniques is utilized as a dielectric for the capacitor 97. The withstand voltage of the insulating film of this type is as low as several ten of volts at most. To limit the voltage across capacitor 97 a pair of voltage regulator diodes 97a and 97b are generally connected back to back across capacitor 97 as shown in FIG. 15. A voltage close to the supply voltage Vcc is normally applied across the capacitor 97 as described above. If the supply voltage Vcc increases to a higher value for any reason, a voltage exceeding the breakdown voltage of the voltage regulator diodes 97a and 97b is applied across the capacitor 97. In this case, a large reverse current flows through the voltage regulator diodes 97a and 97b in a path formed by the diode 982, the voltage regulator diodes 97a, 97b, the nEMOS 942 and ground 9B in the stated order, in accordance with the well-known operation of voltage regulator diodes. This large reverse current is entirely wasted in the gate drive circuit device 9.

In particular, in a device with a high supply voltage, or a device used under a wide range of supply voltages such as automobile electrical equipment, this wasted current increases current consumption in the gate drive circuit device 9.

OBJECTS AND SUMMARY OF THE INVENTION

The present invention has been made in view of the problems with the above-mentioned prior art, and a first object of the invention is to provide a gate drive circuit device for a voltage-driven semiconductor element which is capable of reducing a time required for absorbing an electromagnetic energy $W_L$ stored in inductive electric equipment in a section of the power semiconductor element.

It is a second object of the invention to provide a gate drive circuit device for a voltage-driven semiconductor element which reduces current consumption at a high supply voltage.

The first object of the invention has been achieved by the provision of:

1) A gate drive circuit device for a voltage-driven semiconductor element for giving a gate drive signal to a gate of a main voltage-driven semiconductor element in which the main semiconductor element has one main electrode connected to a power supply or a reference potential and the other main electrode connected to a load, and a voltage stabilizing means for protecting the main semiconductor element from an overvoltage is connected to the main semiconductor element, said drive circuit device comprising: a gate drive signal generator to which a command signal for commanding the ON/OFF operation of the main semiconductor element is input for generating a gate drive signal corresponding to the command signal; a power supply side switching means disposed between a power supply and the gate drive signal generator; and a reference potential side switching means disposed between the gate drive signal generator and the reference potential, wherein the power supply side switching means and the reference potential side switching means are turned ON when the command signal is an ON-command and turned OFF when it is an OFF-command.

2) A gate drive circuit device for a voltage-driven semiconductor element as recited in paragraph 1), wherein the power supply side switching means and/or the reference potential side switching means comprises a voltage-driven semiconductor element having a withstand voltage higher than an operating voltage of the voltage stabilizing means for protecting the main voltage-driven semiconductor element from overvoltage.

3) A gate drive circuit device for a voltage-driven semiconductor element as recited in paragraph 2), wherein the reference potential side switching means is a voltage-driven semiconductor element having a channel of a conductive type different from that of a channel of the main voltage-driven semiconductor element, and the voltage-driven semiconductor element of the reference potential side switching means has a back gate connected to a point having a potential higher than that of the main electrode thereof connected to the gate drive signal generator side.

4) A gate drive circuit device for a voltage-driven semiconductor element as recited in paragraph 2) or 3), further comprising an auxiliary gate drive signal which is in synchronism with the command signal and has a voltage lower than the voltage of the reference potential when the command signal is ON-command, wherein the voltage-driven semiconductor element of the reference potential side switching means has a gate driven by the auxiliary gate drive signal, one main electrode connected to the reference potential and the other main electrode connected to the gate drive signal generator.

5) A gate drive circuit device for a voltage-driven semiconductor element as recited in paragraph 2), wherein the power supply side switching means is a voltage-driven semiconductor element having a channel of a conductivity type different from that of a channel of the main voltage-driven semiconductor element, and the voltage-driven semiconductor element of the reference potential side switching means has a back gate connected to a point having a potential lower than that of the main electrode thereof connected to the gate drive signal generator side.

6) A gate drive circuit device for a voltage-driven semiconductor element as recited in paragraph 2) or 5), further comprising an auxiliary gate drive signal generator for outputting an auxiliary gate drive signal which is in synchronism with the command signal and has a voltage higher than a voltage of the power supply when the command signal is ON-command, wherein the voltage-driven semiconductor element of the power supply side switching means has a gate driven by the auxiliary gate drive signal, one main electrode connected to the power supply and the other main electrode connected to the gate drive signal generator.

The second object of the invention has been achieved by the provision of:

7) A gate drive circuit device for a voltage-driven semiconductor element for giving a gate drive signal to a gate of a main voltage-driven semiconductor element, characterized in that the main semiconductor element has one main electrode connected to a power supply or a reference potential and the other main electrode connected to a load, and there are provided an auxiliary reference voltage circuit device connected between a power supply and the reference potential for outputting an auxiliary reference voltage which is an intermediate value between a supply voltage and a voltage of the reference potential and varies in accordance with a variation of the supply voltage so as to maintain a difference between that voltage and the supply voltage substantially constant, and a gate drive signal generator to which a command signal for commanding the ON/OFF operation of the main semiconductor element is input for generating a gate drive signal corresponding to the command signal, wherein the gate drive signal generator uses the auxiliary reference voltage as a reference voltage.

8) A gate drive circuit device for a voltage-driven semiconductor element as recited in paragraph 7), wherein the auxiliary reference voltage circuit device has a voltage-driven semiconductor element and a constant-voltage circuit device for outputting a gate voltage to a gate of the semiconductor element, a difference between the gate voltage and the supply voltage being maintained substantially constant, the semiconductor element has one main electrode connected to the reference potential side and the other main electrode which outputs the auxiliary reference voltage, and the constant-voltage circuit device is connected between the power supply and the reference potential.

9) A gate drive circuit device for a voltage-driven semiconductor element as recited in paragraph 8), wherein the constant-voltage circuit device of the auxiliary reference voltage circuit device includes a voltage regulator diode and a resistance element, the constant-voltage diode is arranged at the power supply side and the resistance element is arranged at the reference potential side so that the constant-voltage diode and the resistance element are connected in series to each other, and the gate voltage is output from a node between the constant-voltage diode and the resistance element.

10) A gate drive circuit device for a voltage-driven semiconductor element as recited in paragraph 8), wherein the constant-voltage circuit device of the auxiliary reference voltage circuit device includes a constant-voltage diode, a resistance element and a negative voltage generating circuit device, the constant-voltage diode is arranged at the power supply side and the resistance element and a series circuit consisting of the negative voltage generating circuit device is arranged at the reference potential side so that the constant-voltage diode and the series circuit are connected in series to each other, and the gate voltage is output from a node between the constant-voltage diode and the series circuit consisting of the resistance element and the negative voltage generating circuit device.

Briefly stated, the present invention provides a gate drive circuit device for a voltage-driven semiconductor element which reduces the time to dissipate inductively stored electromagnetic energy and reduces current consumption by using cyclically charged capacitative storage to produce a control signal that is about twice the supply voltage. This permits full-ON dissipation of the stored energy after the circuit cuts off power to the inductive element. In one embodiment, the dissipation is chiefly in a voltage-regulator diode connected to limit the voltage appearing across a transistor. In another embodiment, a voltage regulator diode permits a transistor to operate in the full-on condition, while limiting the voltage across it to a value below its withstand voltage, whereby a maximum power dissipation current flows in the transistor. In a further embodiment a gate drive signal generator eliminates a voltage regulator diode from the conventional gate drive circuit device. Instead, this embodiment substitutes switching devices both on the power supply side and the reference potential (ground) side. Both switching devices include a switch and an operating section that controls switching operation. The two operating sections receive an externally generated command signal for timing the ON/OFF operation of the switches. The control technique permits both the switching and operating sections to be fabricated integrally as an integrated circuit.

According to an embodiment of the invention, there is provided a gate drive circuit device for a voltage-driven semiconductor element for feeding a gate drive signal to a gate of a main voltage-driven semiconductor element, comprising: a first main electrode of the main semiconductor element being connected to one of a power supply and a reference potential, a second main electrode of the main semiconductor element is connected to a load, a voltage stabilizing means for protecting the main semiconductor element from over-voltage, the voltage stabilizing means being connected to the main semiconductor element, a gate drive signal generator receiving a command signal for commanding ON/OFF operation of the main semiconductor element, means for generating a gate drive signal corresponding to the command signal, a power supply side switching means disposed between a power supply and the gate drive signal generator, a reference potential side switching means disposed between the gate drive signal generator and the reference potential, means for turning ON the power supply side switching means and the reference potential side switching means when the command signal is an ON-command and for turning OFF power supply side switching means and the reference potential side switching means when the command signal is an OFF-command.

According to a feature of the invention, there is provided a gate drive circuit device for a voltage-driven semiconductor element for feeding a gate drive signal to a gate of a main voltage-driven semiconductor element, comprising: the main semiconductor element includes a first main electrode connected to one of a power supply or a reference potential, the main semiconductor element includes a second main electrode connected to a load, an auxiliary reference voltage circuit device between the power supply and the reference potential, the auxiliary reference voltage circuit device including means for producing an auxiliary reference voltage which is an intermediate value between a supply voltage and a voltage of the reference potential, means for varying the auxiliary reference voltage in relation to variations in the supply voltage in a manner to maintain a difference between the auxiliary reference voltage and the supply voltage substantially constant, a gate drive signal generator receiving a command signal for commanding the ON/OFF operation of the main semiconductor element, and the gate drive signal generator using the auxiliary reference voltage as a reference voltage.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
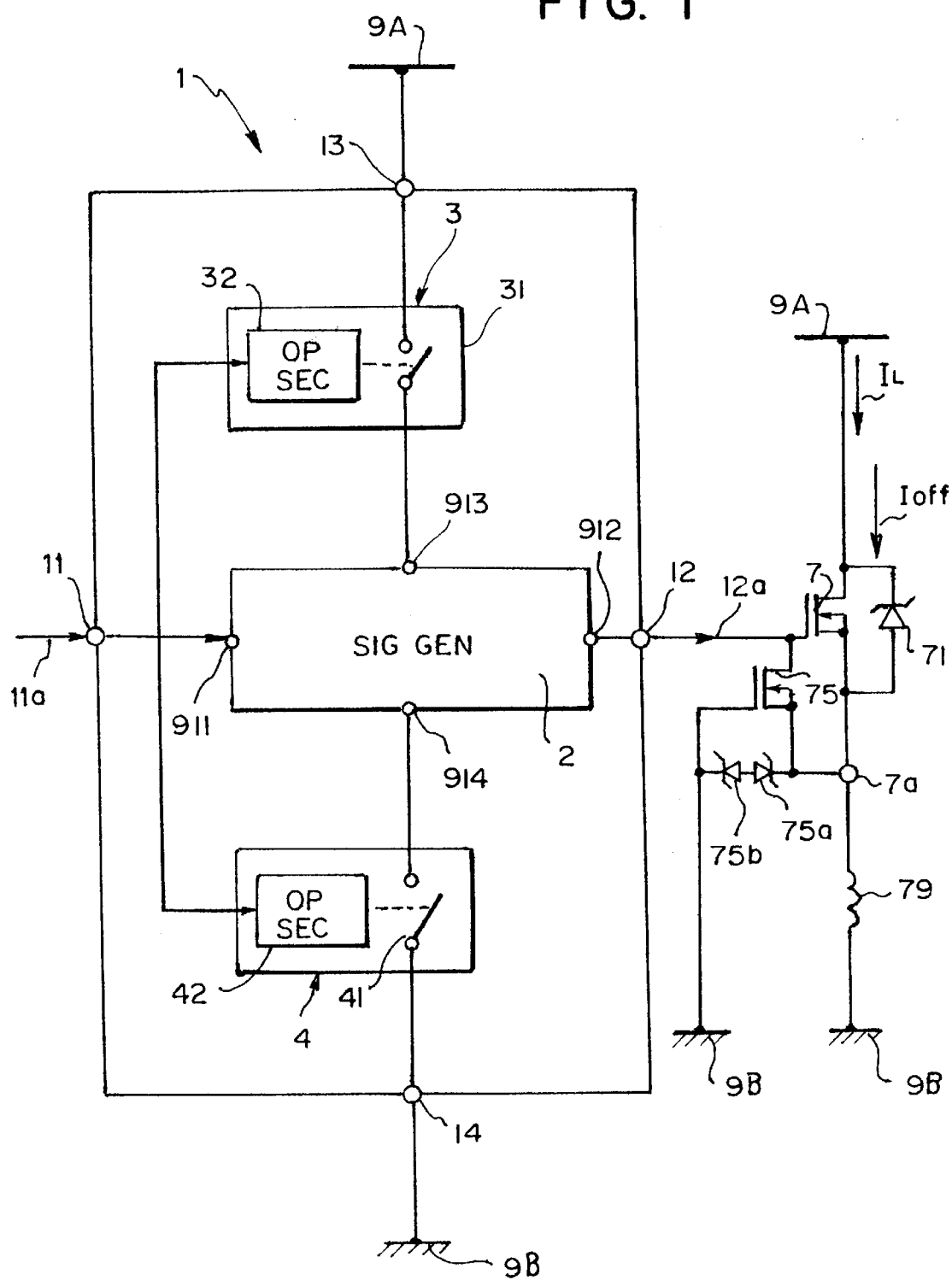
FIG. 1 is a block diagram of one embodiment of a gate drive circuit device for a voltage-driven semiconductor element according to an embodiment of the invention.

A gate drive circuit device applies a gate drive signal to a gate of a main voltage-driven semiconductor element. The main semiconductor element has one main electrode connected to a power supply or a reference potential and the other main electrode connected to a load. A voltage stabilizing means or protecting the main semiconductor element from an overvoltage is connected to the main semiconductor element. A gate drive signal generator receives a command signal for producing a gate drive signal, corresponding to the command signal. A power supply side switching means is disposed between a power supply and the gate drive signal generator. The power supply side switching means is composed, for example, of a voltage-driven semiconductor element having a withstand voltage higher than a value of a counter electromotive force generated from a load when the command signal is switched from the ON-command to the OFF-command. A reference potential side switching means is disposed between the gate drive signal generator and the reference potential. The reference potential side switching means is, for example, a voltage-driven semiconductor element having a withstand voltage higher than a value of the counter electromotive force generated from a load device when the command signal is switched from the ON-command to the OFF-command. The power supply side switching means and the reference potential side switching means are turned ON when the command signal is an ON-command and turned OFF when it is an OFF-command.

The above structure produces the following effect:

As was described in the background of the invention, when the load connected to the other main electrode of the power semiconductor element is an inductive electric equipment having an inductance L, a high counter electromotive force is developed from the load when the command signal is switched from the ON-command to the OFF-command. The gate potential of the power semiconductor element is lowered below that of the reference potential by development of the counter electromotive force. With the lowered gate potential of the power semiconductor element, a current flows into that gate from the reference potential, thereby turning the power semiconductor element half-ON. With the lowered potential of the gate of the power semiconductor element, current flows into that gate not only from the point of the reference potential but also from the power supply. In order to prevent current from flowing into the gate of the power semiconductor element whose potential is lower than the reference potential, current must be prevented from flowing from both the power supply and the reference potential. Since the power supply side switching means is disposed between the power supply side end of the gate drive signal generator and the power supply, turning the power supply side switching means OFF prevents the current from flowing from the power supply. Because the reference potential side switching means is disposed between the reference potential side end of the gate drive signal generator and the reference potential, when the reference potential side switching means is turned OFF it prevents current from flowing from the reference potential.

In this manner, the voltage produced by the counter electromotive force generated at the load when the power semiconductor element is turned OFF is applied, not to the gate drive signal generator, but to the power semiconductor element and the voltage stabilizing means by turning both the power supply side switching means and the reference potential side switching means OFF. For this, the operating voltage of the voltage stabilizing means is set to a values, lightly lower than the withstand voltage of the power semiconductor element so that the electromagnetic energy $W_L$ stored in the load at the time of the ON-operation of the load is absorbed mainly by the voltage stabilizing means or power semiconductor element. This prevents breakdown of the power semiconductor element due to the counter electromotive force. Moreover, setting the operating voltage of the voltage stabilizing means to the value slightly lower than the withstand voltage of the power semiconductor element enables the voltage stabilizing means and the power semiconductor element to absorb an increased amount of energy per unit time in comparison with the prior art.

(2) In the above paragraph (1), the power supply side switching means and/or the reference potential side switching means include a voltage-driven semiconductor element having a withstand voltage higher than the operating voltage of the voltage stabilizing means for protecting the main voltage-driven semiconductor element from over-voltage. The operation of this structure will be described.

In the composition described in the above paragraph (1), the counter electromotive force generated at the load when the power semiconductor element is turned OFF is applied to the turned OFF power supply side switching means and/or reference potential side switching means. At this time, with the above composition of the voltage-driven semiconductor elements constituting the power supply side switching means and/or reference potential side switching means, those semiconductor elements can perform desired operations without any difficulty even when a voltage due to a counter electromotive force is applied. Hence, the gate drive circuit device can be entirely constituted with electronic circuit parts for which the power supply side switching means and/or reference potential side switching means are composed without providing switching means having mechanical contacts.

(3) In paragraph (2) above, the reference potential side switching means includes a voltage-driven semiconductor element having a channel of a conductivity type different from that of a channel of the main voltage-driven semiconductor element. The back gate of the voltage-driven semiconductor element is connected to a point having a potential higher than the potential of the main electrode thereof. The main electrode is connected to the gate drive signal generator side.

In operation of the composition described in the paragraph (2), a description will be given first of a case where the main n-type voltage-driven semiconductor element and the voltage-driven semiconductor element forming the reference potential switching means are formed on the same semiconductor substrate.

Figure 16:
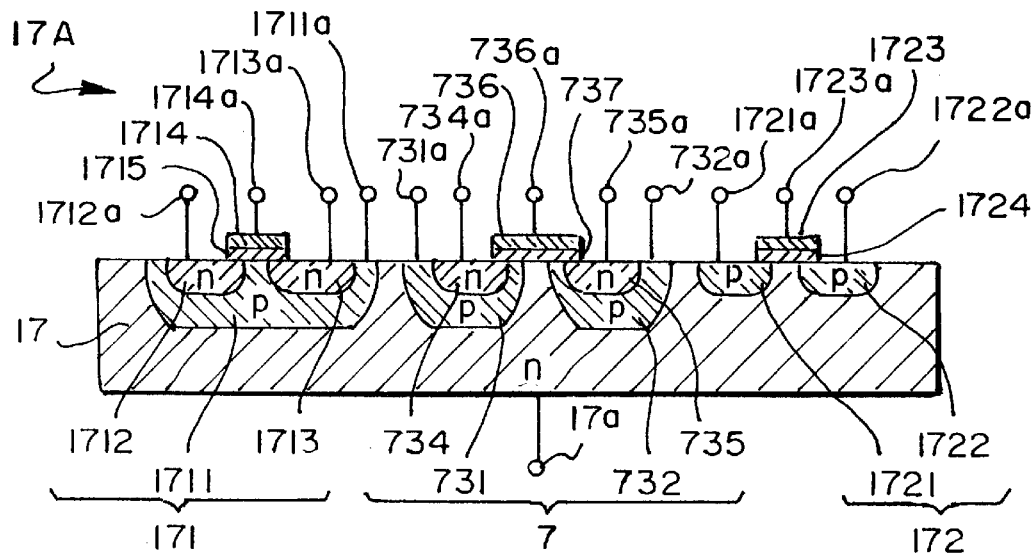
FIG. 16 is a longitudinal cross sectional view schematically showing a one-chip power semiconductor element in which a main n-type voltage-driven semiconductor element, a voltage-driven semiconductor element forming a reference potential side switching means, and a voltage-driven semiconductor element forming a power supply side switching means are formed integrally on the same semiconductor substrate.

Referring to FIG. 16, a one-chip power semiconductor element 17A includes an n-type semiconductor substrate 17. An n-type nEMOS 171 and a pEMOS 172 are formed integrally on substrate 17. An nEMOS 7 is integrally formed on substrate 17 between n-type EMOS 171 and pEMOS 172. The nEMOS 7 functions as an n-type voltage-driven semiconductor element that is formed by conventional semiconductor manufacturing techniques.

The nEMOS 7 is formed as a vertical nEMOS on the semiconductor substrate 17 constituting its drain. The nEMOS 7 includes p-type wells 731 and 732, and n-type regions 734 and 735 constituting sources of the nEMOS 7. An aluminum film 736 is a gate electrode film. An oxide film 737 functions as a gate insulating film. A drain terminal 17*a* extends from the semiconductor substrate 17. Back gate terminals 731*a* and 732*a* extend from the p-type wells 731 and 732. Source terminals 734*a* and 735*a* extend from the n-type regions 734 and 735. A gate terminal 736*a* extends from the film 736.

The nEMOS 171 is a voltage-driven semiconductor element functioning as the reference potential side switching means. The nEMOS 171 is formed on the semiconductor substrate 17 as a horizontal nEMOS. The nEMOS 171 includes a p-type well 1711, an n-type region 1712 forming a drain thereof, an n-type region 1713 forming a source thereof, an aluminum film 1714 forming a gate electrode film, and an oxide film 1715 forming a gate insulating film thereof. A back gate terminal 1711*a* extends from the p-type well 1711. A drain terminal 1712*a* extends from the n-type region 1712. A source terminal 1713*a* extends from the n-type region 1713. A gate terminal 1714*a* extends from the film 1714.

The pEMOS 172 is a voltage-driven semiconductor functioning as the power supply side switching means. pEMOS 172, is formed on the semiconductor substrate 17 as a horizontal pEMOS. The pEMOS 172 includes a p-type region 1721 forming a source thereof, a p-type region 1722 forming a drain thereof, an aluminum film 1723 forming a gate electrode film, and an oxide film 1724 forming a gate insulating film. A source terminal 1721*a* extends from the p-type region 1721. A drain terminal 1722*a* extends from the p-type region 1722. A gate terminal 1723*a* extends from the film 1723.

In the one-chip power semiconductor element 17A thus constituted, the back gate terminal 1711*a* of the nEMOS 171 is connected to ground 9B which is the lowest potential level within the semiconductor substrate 17. When the potential of that gate becomes lower than that of ground 9B, at the time when the nEMOS 7 is switched from ON to OFF, the potential of the n-type region 1712, which forms the drain of the nEMOS 171 connected to the gate side thereof, is lower than ground potential 9B. Hence, in this situation, the potential of the n-type region 1712 is lower than the potential of the p-type well 1711. As a result, a p-n junction between the p-type well 1711 and the n-type region 1712 is forward-biased, and a current flows in a path formed by ground 9B, the p-type well 1711, the n-type region 1712 (which is the drain of the nEMOS 171), and the gate of the nEMOS 7 in the stated order. In other words, the nEMOS 171 is unable to serve as a reference potential side switching means.

On the contrary, the voltage-driven semiconductor element forming the reference potential side switching means, on the basis of the present invention, includes a voltage-driven semiconductor element having a channel of a conductivity type different from that of a channel of the main voltage-driven semiconductor element. The back gate of the voltage-driven semiconductor element is connected to a portion with a potential higher than that of a main electrode thereof connected to the gate drive signal generator side. With this composition, where the main semiconductor element is the nEMOS 7, the voltage-driven semiconductor element forming the reference potential side switching means is of the p-type. For example, a pEMOS is used therefor. When a pEMOS is substituted for the nEMOS 7, the back gate of that pEMOS is connected, on the basis of the present invention, for example, to a point of the highest potential level of the semiconductor substrate on which the nEMOS 7 and the pEMOS are integrally formed. Hence, even though the gate of the nEMOS 7 is lower than ground potential 9B, no current path is formed by a forward-biased p-n junction. As a result, the voltage-driven semiconductor element serving as the reference potential side switching means can be formed integrally with the semiconductor substrate on which the main voltage-driven semiconductor element is formed.

(4) In paragraphs (2) or (3)above, an auxiliary gate drive signal generator generates an auxiliary gate drive signal which is in synchronization with a command signal but has a voltage lower than that of the reference potential when the command signal is ON-command. A voltage-driven semiconductor element of the reference potential side switching means has a gate thereof driven by the auxiliary gate drive signal. One main electrode of the voltage-driven semiconductor element is connected to the reference potential, and the other main electrode is connected to the gate drive signal generator. The operation of this structure will now be described.

An example where a voltage-driven semiconductor element of the reference potential side switching means is a pEMOS will now be described. Generally, in order to turn the pEMOS ON or to hold the pEMOS ON, the potential of its gate must be lower than that of its source. In the pEMOS of the present invention, from the necessary factor of the invention, when the pEMOS is ON, the potential of its source electrode as the other main electrode is equal to the reference potential which is the potential of the drain electrode as one main electrode. Hence, by maintaining the gate potential of the pEMOS at a value lower than that of the reference potential, the pEMOS can be held in a sufficiently stable ON-state.

(5) In paragraph (2)above, the power supply side switching means includes a voltage-driven semiconductor element having a channel of a conductivity type different from that of a channel of the main voltage-driven semiconductor element. The back gate of the voltage-driven semiconductor element is connected to a point having a potential lower than the potential of its main electrode connected to the gate drive signal generator side.

The operation of the composition described in paragraph (2)above, when the main voltage-driven semiconductor element and the voltage-driven semiconductor element forming the power supply side switching means are p-type and both are formed on the same semiconductor substrate, will now be described.

Figure 17:
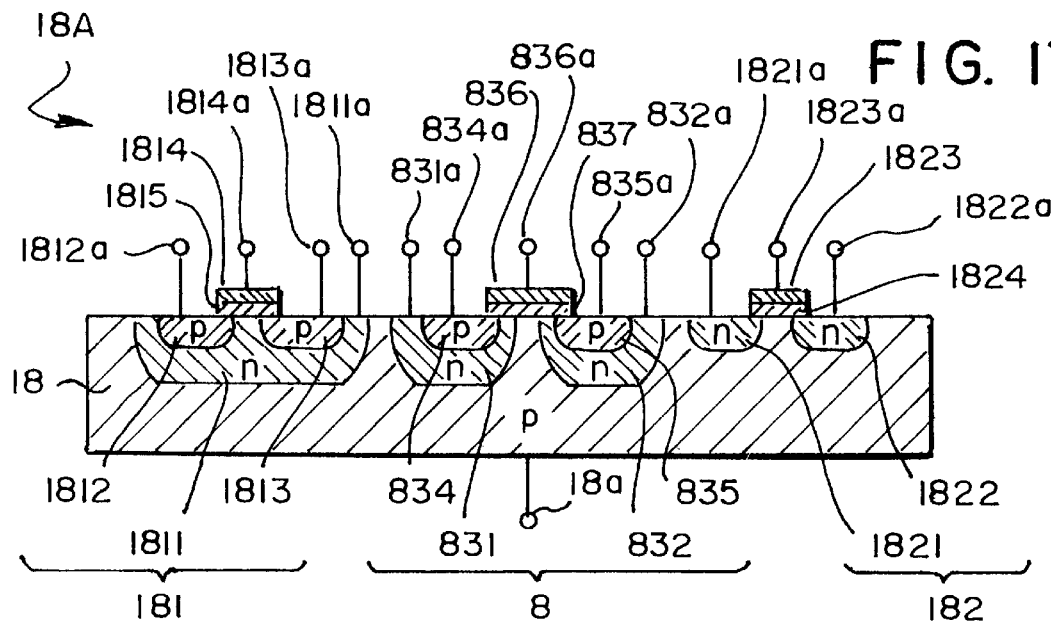
FIG. 17 is a longitudinal cross sectional view schematically showing one-chip power semiconductor element where a p-type main voltage-driven semiconductor element, a voltage-driven semiconductor element serving as the power supply switching means, and a voltage-driven semiconductor element serving as ground potential side switching means are integrally formed on the same semiconductor substrate.

Referring now to FIG. 17, a one-chip power semiconductor element 18A includes, integrally formed on the same substrate, a p-type main voltage-driven semiconductor element, a voltage-driven semiconductor element serving as the power supply switching means, and a voltage-driven semiconductor element serving as ground potential side switching means.

In FIG. 17, a pEMOS 181 and an nEMOS 182 are formed integrally with a p-type semiconductor substrate 18. A pEMOS 8 centered in substrate 18 forms a main p-type voltage-driven semiconductor element. Voltage-driven semiconductor element 18A is formed by conventional semiconductor manufacturing techniques.

The pEMOS 8 is a vertical pEMOS on the semiconductor substrate 18. The semiconductor substrate 18 is the source of pEMOS 8. Two n-type wells 831, 832 are formed in semiconductor substrate 18. Two p-type regions 834 and 835, both forming drains, are formed in n-type wells 831 and 832, respectively. An aluminum film 836 bridging the n-type wells 831 and 832 forms a gate electrode film. An oxide film 837 beneath aluminum film 836 is a gate insulating film. A source terminal 18a extends from the semiconductor substrate 18. Back gate terminals 831a and 832a extend from the p-type wells 831 and 832. Drain terminals 834a and 835a extend from the p-type regions 834 and 835. A gate terminal 836a extends from the film 836.

The pEMOS 181 is a voltage-driven semiconductor element serving as a power supply side switching means. The pEMOS 181 is formed on the semiconductor substrate 18 as a horizontal pEMOS. The pEMOS 181 includes an n-type well 1811, a p-type region 1812 forming a source, a p-type region 1813 forming a drain, an aluminum film 1814 forming a gate electrode film, and an oxide film 1815 forming a gate insulating film. A back gate terminal 1811a extends from the n-type well 1811, a source terminal 1812a extends from the p-type region 1812, a drain terminal 1813a extends from the p-type region 1813, and a gate terminal 1814a extends from the film 1814.

The nEMOS 182 is a voltage-driven semiconductor element serving as the reference potential side switching means. The nEMOS 182 is formed on the semiconductor substrate 18 as a horizontal nEMOS. The nEMOS 182 includes an n-type region 1821 forming a drain, and an n-type region 1822 forming a source. An aluminum film 1823, bridging n-type regions 1821 and 1822, forms a gate electrode film. An oxide film 1824 below aluminum film 1823 forms a gate insulating film. A drain terminal 1821a extends from the n-type region 1821, a source terminal 1822a extends from the n-type region 1822, and a gate terminal 1823a extends from the film 1823.

An example in which the pEMOS 8 is used as a power semiconductor element is basically the same as the example described in the prior art using the nEMOS 7 as the power semiconductor element, except that the electromagnetic coil 79 forming a load is connected between the source of the pEMOS 8 and the power supply 9A. Also, a pEMOS is connected between the source and gate of the pEMOS 8. The connected pEMOS corresponds to the nEMOS 75 for the power semiconductor element nEMOS 7. The gate of the pEMOS is connected to the power supply 9A. In using the pEMOS 8 as the power semiconductor element, when the pEMOS 8 is switched from the ON-operation to the OFF-operation, the potential at its source potential rises to a value higher than the potential of the power supply 9A from the counter electromotive force generated from the electromagnetic coil 79. As a result, the potential of the gate of the pEMOS 8 is also raised higher than that of the power supply 9A because of the existence of the pEMOS.

In the one-chip power semiconductor element 18A thus constituted, the back gate terminal 1811*a* is connected to the power supply 9A. The potential of the gate of the pEMOS 8 rises to a value higher than that of the power supply 9A. This also raises the potential of the p-type region 1813 which forms the drain of the pEMOS 181. The potential of the p-type region 1813 is connected to the gate side of the pEMOS 8, which has a potential higher than the potential of the power supply 9A. Therefore, the potential of the p-type region 1813 is raised to a value higher than that of the n-type well 1811. As a result, the p-type region 1813 and the n-type well 1811 are forward-biased, and a current flows in a path made up of the power supply 9A, the p-type region 1813 (drain of the pEMOS 181), the n-type well 1811, and the gate of the pEMOS 8 in the stated order. In other words, the pEMOS 181 is unable to serve as the power supply side switching means.

On the contrary, according to the present invention, the voltage-driven semiconductor element forming the power supply side switching means is composed of a voltage-driven semiconductor element having a channel of a conductivity type different from that of the channel of the main voltage-driven semiconductor element. It includes a back gate connected to a point having a potential lower than that of its main electrode which is in turn, connected to the gate drive signal generator side. With this structure, for the main semiconductor element pEMOS 8, an nEMOS, for example, is used as the voltage-driven semiconductor element forming the power supply side switching means. When using the nEMOS instead of the pEMOS, the back gate of the nEMOS is connected to a point of the lowest potential of, for example, the semiconductor substrate on which the pEMOS 8 and the nEMOS are integrally formed. Therefore, even though the potential of the gate of the pEMOS 8 rises higher than that of the power supply 9A, no current path exists because of the forward-biased p-n junction formed in the nEMOS. Hence, the voltage-driven semiconductor element serving as the power supply side switching element can be integrated on the semiconductor substrate on which the main voltage-driven semiconductor element is formed.

(6) In paragraphs (2) or (5)above, there is provided an auxiliary gate drive signal generator for generating an auxiliary gate drive signal which is in synchronization with a command signal and has a voltage higher than that of the power supply when the command signal is an ON-command. The voltage-driven semiconductor element of the power supply side switching means has a gate thereof driven by the auxiliary gate drive signal. One main electrode of the voltage-driven semiconductor element is connected to the power supply. The other main electrode is connected to the gate drive signal generator. The operation of this structure will next be described.

An example in which the voltage-driven semiconductor element of the power supply side switching means is an nEMOS will now be described. In general, in order to turn ON an nEMOS or to hold it in the ON-state, the potential of its gate must be higher than that of its source. In the nEMOS of the present invention, from the essential factors of the invention, the potential of the source forming the other main electrode in the ON-state is equal to the potential of the power supply. The drain of the nEMOS is also at the potential of the power supply. Therefore, by maintaining the gate potential of the nEMOS at a value higher than that of the power supply, the nEMOS can be held in a stable ON-state.

(7) A gate drive circuit device for feeding a gate drive signal to a gate of a main voltage-driven semiconductor element is characterized by the main semiconductor element having one main electrode connected to a power supply or a reference potential and the other main electrode connected to a load. In addition an auxiliary reference voltage circuit device is connected between a power supply and the reference potential. The auxiliary reference voltage device outputs an auxiliary reference voltage which is an intermediate potential between a supply voltage and a voltage of the reference potential and varies in accordance with a variation of the supply voltage so as to maintain a substantially constant difference between the auxiliary reference voltage and the supply voltage. A gate drive signal generator receives a command signal for commanding the ON/OFF operation of the main semiconductor element. In response to the command signal, the gate drive signal generator generates a gate drive signal corresponding to the command signal. The gate drive signal generator uses the auxiliary reference voltage as a reference voltage. The auxiliary reference voltage circuit device includes, for example, a voltage-driven semiconductor element and a constant-voltage circuit device for outputting a voltage, which has a substantially constant difference from the supply voltage, to the gate of that semiconductor element. The constant-voltage circuit includes, for example, a voltage regulator diode and a resistance element so that the voltage regulator diode is arranged at the power supply side and the resistance element at the reference potential side so as to be connected in series for outputting the gate voltage from a node between them.

With this composition, a voltage is applied to the gate of the voltage-driven semiconductor element of the auxiliary reference voltage circuit device. This voltage is due to a built-in potential of the voltage regulator diode when the power voltage is equal to or under a breakdown voltage of the voltage regulator diode, and a voltage equal to a difference between the supply voltage and the breakdown voltage of the voltage regulator diode when the supply voltage exceeds a sum of the voltage due to the built-in potential and the breakdown voltage of the voltage regulator diode. Accordingly, the voltage-driven semiconductor element of the auxiliary reference voltage circuit device is adapted to output an auxiliary reference voltage having a substantially constant difference from the supply voltage, which is the same as the breakdown voltage of the voltage regulator diode. Since the gate drive signal generator is supplied with its power from between the supply voltage and this auxiliary reference voltage, even though the supply voltage varies, a voltage supplied to the gate drive signal generator is regulated to be equal to or less than the breakdown voltage of the voltage regulator diode.

As a result, a circuit element of the drive signal generator to which the supply voltage is applied, for example, a capacitor for the charging pump, can be supplied with a voltage limited to the level of the breakdown voltage of the voltage regulator diode at the highest.

(8) In the gate drive circuit device described in paragraph (7) above, the constant-voltage circuit device of the auxiliary reference voltage circuit device includes a voltage regulator diode, a resistance element and a negative voltage generating circuit device. The voltage regulator diode is arranged at the power supply side and a series circuit consisting of the resistance element and the negative voltage generating circuit device is arranged at the reference potential side so that the voltage regulator diode and the series circuit are connected in series with each other. The gate voltage is the output from a node between the voltage regulator diode and the series circuit consisting of the resistance element and the negative voltage generating circuit device.

With this structure, in obtaining the effect of the operation of the structure described in paragraph (7) above, a voltage output from the constant-voltage circuit device is reduced by a voltage generated by the negative voltage generating circuit device. Therefore, when the supply voltage is equal to or lower than the breakdown voltage of the voltage regulator diode, the voltage generated by the constant-voltage circuit device has a value equal to the voltage from the built-in potential of the voltage regulator diode reduced by a voltage generated by the negative voltage generating circuit device. Also, the supply voltage at which a gate voltage, a differential voltage between the supply voltage and the breakdown voltage of the voltage regulator diode, starts to be generated is a value to which the sum of the voltage due to the built-in potential and the breakdown voltage of the voltage regulator diode is reduced by a voltage generated by the negative voltage generating circuit device.

As a result, a range of the supply voltage, in which the difference between the supply voltage and the auxiliary reference voltage generated by the auxiliary reference voltage circuit device is substantially constant as being equal to the breakdown voltage of the voltage regulator diode, can be expanded toward a lower voltage range by an amount equal to the voltage generated by the negative voltage generating circuit device.

Embodiment 1

Figure 2:
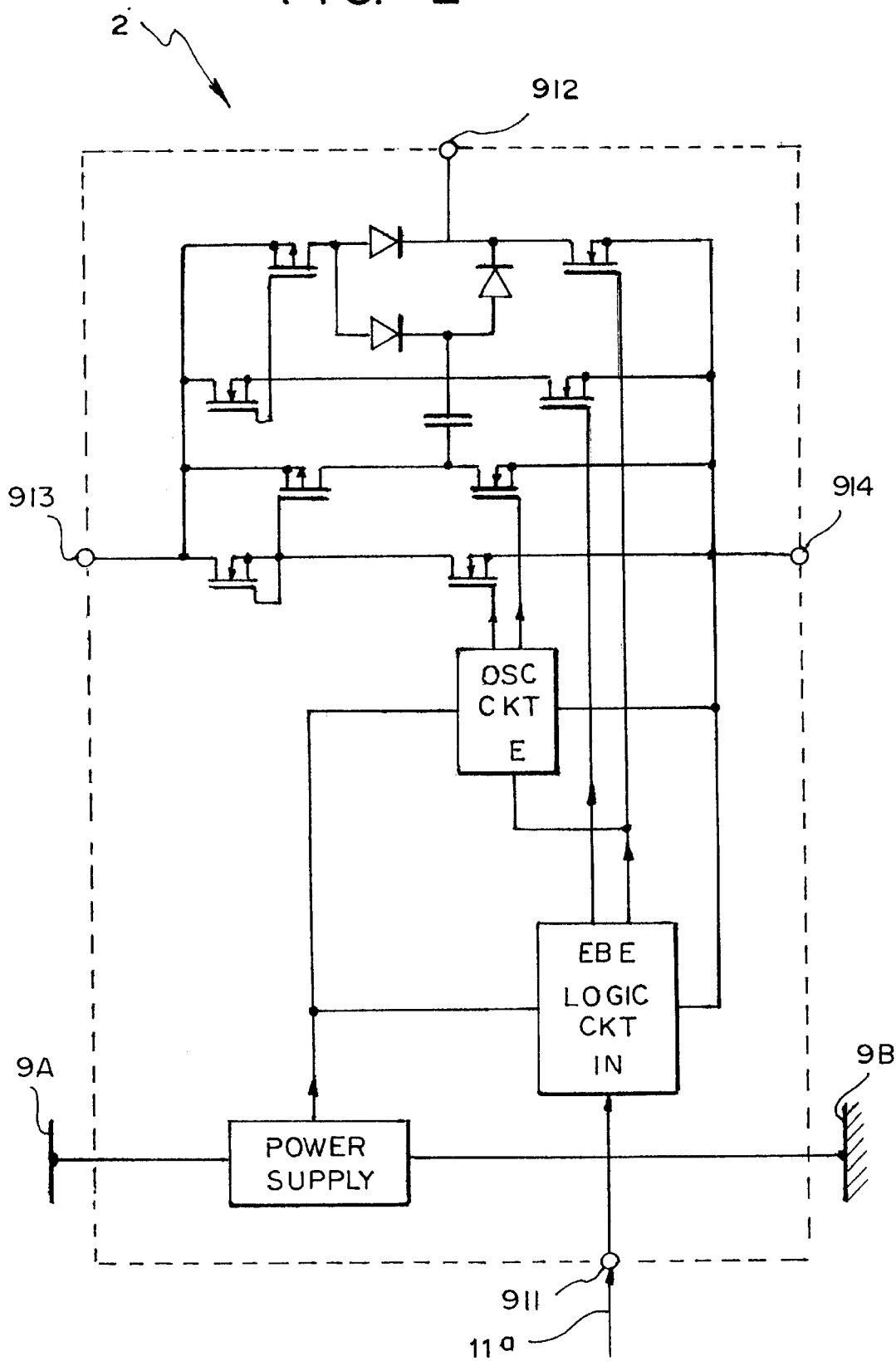
FIG. 2 is a circuit diagram illustrating the gate drive circuit device of FIG. 1.
Figure 14:
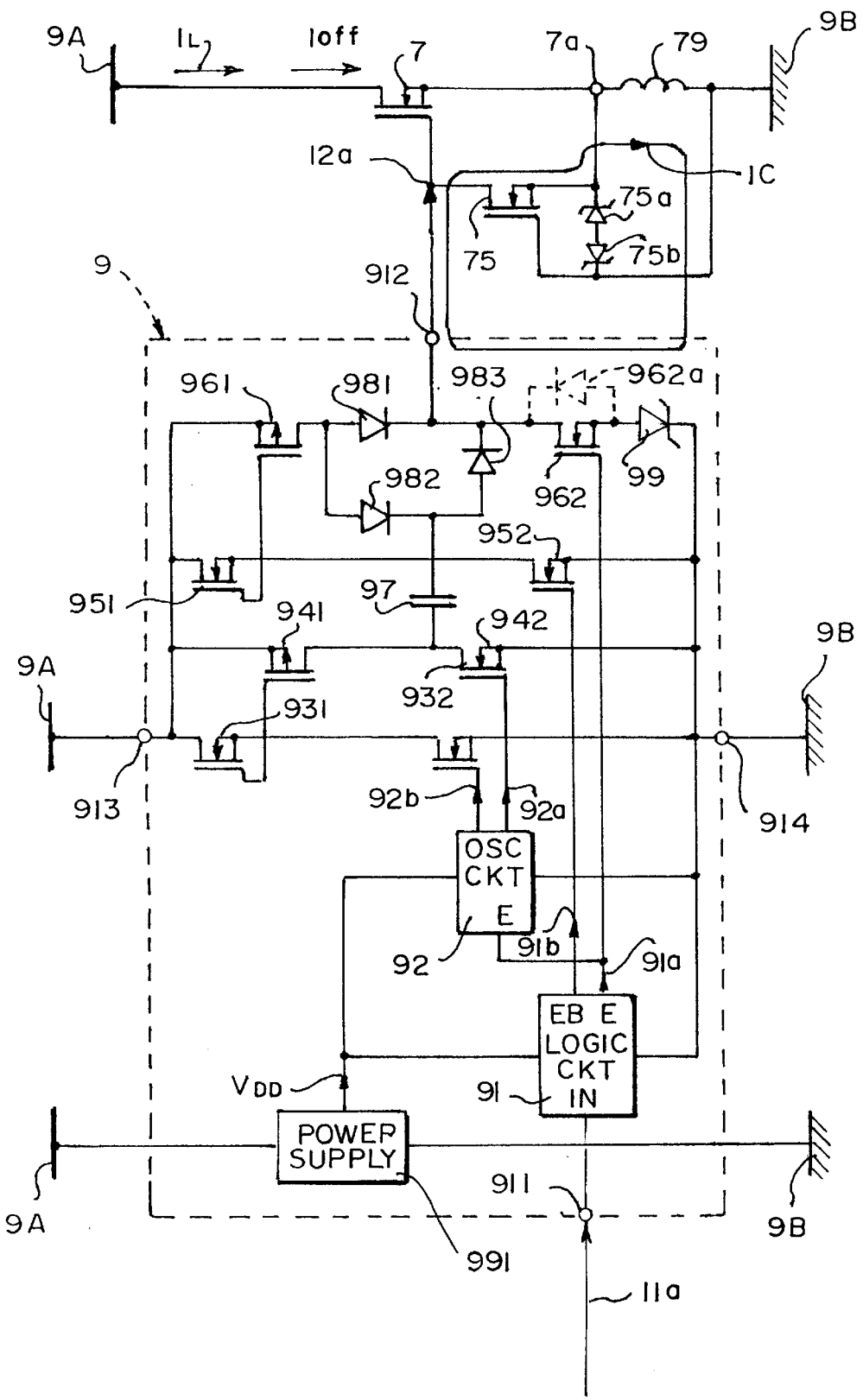
FIG. 14 is a circuit diagram showing a power semiconductor element and associated ones in a conventional gate drive circuit device for a voltage-driven semiconductor element according to the prior art.
Figure 15:
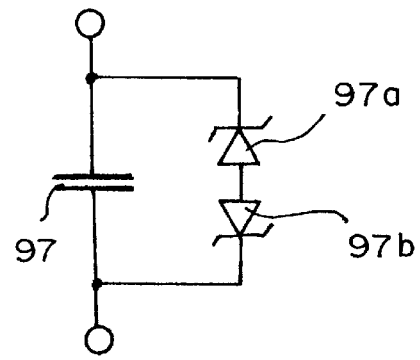
FIG. 15 is a circuit diagram showing a capacitor used in a charging pump.

Referring to FIGS. 1 and 2, a gate drive circuit device 1 for a voltage-driven semiconductor element is similar to the prior-art circuit of FIG. 14, from which the voltage regulator diode 99 is omitted. Gate drive circuit 1 includes a gate drive signal generator 2, a power supply side switching means 3, and a reference potential side switching means 4 all performing the same functions as described in connection with the prior-art device of FIG. 14. The power supply side switching means 3 includes a switching device 31 for switching an electric circuit and an operating section 32 for controlling the switching device 31 in performing its switching operation. The switching device 31 is connected between a power supply terminal 13 of the gate drive circuit device 1 and a power supply terminal 913 of the gate drive signal generator 2. The operating section 32 receives a command signal 11a at command input terminal 11. Operating section 32 produces a signal for closing the switching device 31 when the command signal 11a is an ON-command, and a signal for opening the switching device 31 when the command signal 11a is an OFF-command.

The reference potential side switching means 4 includes a switching device 41 for switching the reference voltage side of the electric circuit. An operating section 42 receives the command signal 11a at its input and produces a command signal for controlling the switching device 41 to perform its switching operation. The switching device 41 is connected between a reference potential terminal 14 of the gate drive circuit device 1 and a reference potential terminal 914 of the gate drive signal generator 2. The operating section 42 closes the switching device 41 in response to command signal 11a being an ON-command, and opens the switching device 41 when the command signal 11a is an OFF-command.

A gate of the nEMOS 7 receives the gate drive signal 12a output from the gate drive signal generator 2 through an output terminal 912 of the gate drive signal generator 2 and an output terminal 12 of the gate drive circuit device 1. A voltage regulator diode 71 is connected in parallel with the drain and source of nEMOS 7 to serve as a voltage stabilizing means. The voltage regulator diode 71 has a breakdown voltage, which is an operating voltage thereof, that is slightly lower than the withstand voltage of the nEMOS 7.

When the nEMOS 7 is turned OFF by the gate drive signal 12a switching from "H" to "L", the electromagnetic coil 79 generates a counter electromotive force the same manner as in the conventional gate drive circuit device 9 of FIG. 14.

In the gate drive circuit device 1 in accordance with the present invention, at the same time that the nEMOS 7 is turned OFF by the command signal 11a, the switching device 31 and the switching device 41 are opened. Therefore, the voltage due to the counter electromotive force is applied only to a parallel circuit consisting of the nEMOS 7 and the voltage regulator diode 71. The counter electromotive force is applied to this parallel circuit. As long as the counter electromotive force exceeds the breakdown voltage of the voltage regulator diode 71, the voltage regulator diode 71 operates in its breakdown region. Since, as noted above, the breakdown voltage is slightly less than the withstand voltage of nEMOS 7, the nEMOS 7 is protected while a current $I_{off}$ produced by the release of inductively stored electromotive energy $W_L$ (which has been stored while the nEMOS 7 is ON) from the electromagnetic coil 79 flows through the voltage drop of the voltage regulator diode 71. In this manner, most of the electromagnetic energy $W_L$ is absorbed with the voltage regulator diode 71. The amount of electromagnetic energy $W_L$ absorption in the voltage regulator diode 71 is remarkably increased compared to the electromagnetic energy absorption in the nEMOS 7 in its half-ON state in the conventional gate drive circuit device 9 of FIG. 14. As a result, a time required for absorbing the electromagnetic energy $W_L$ is reduced substantially.

Embodiment 2

Figure 3:
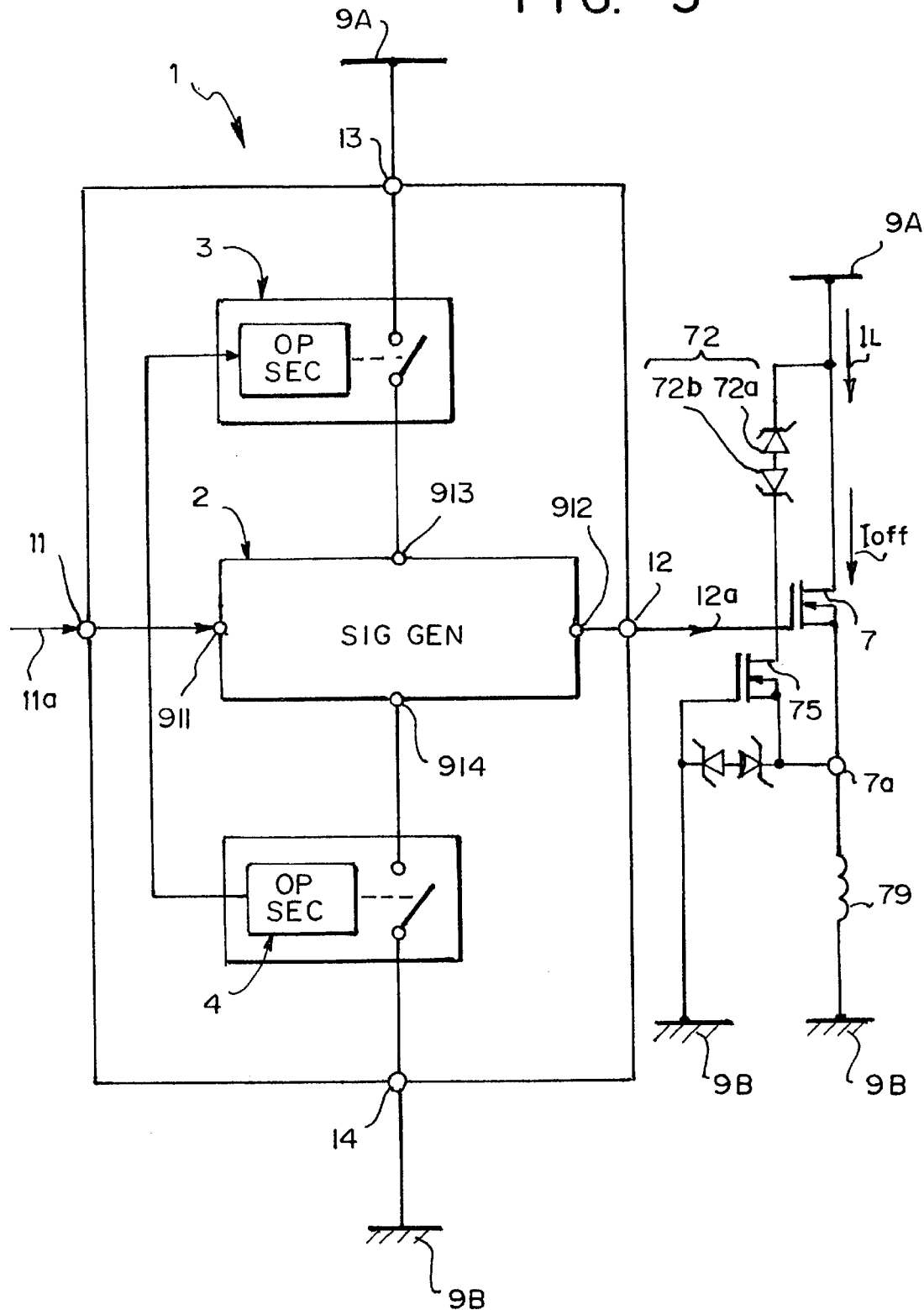
FIG. 3 is a block diagram of another embodiment of a gate drive circuit device for a voltage-driven semiconductor element according to the present invention.

Referring now to FIG. 3, the nEMOS 7 is driven by the gate drive circuit device 1. A voltage regulator diode device 72 is connected in parallel with the drain and gate of nEMOS 7 to serve as the voltage stabilizing means. The voltage regulator diode device 72 is made up of a pair of back-to-back voltage regulator diodes 72a and 72b. The voltage regulator diode 72a has a breakdown voltage that is slightly lower than the source/gate withstand voltage of the nEMOS 7. Thus, the voltage regulator diode 72a operates in its breakdown condition when a voltage applied between the drain and source of the nEMOS 7 approaches the withstand voltage of the nEMOS 7. The voltage regulator diode 72b blocks current flow from the gate of the nEMOS 7 toward the power supply 9A.

With the above structure of the embodiment shown in FIG. 3, when the gate drive signal 12a switches from "H" to "L", a counter electromotive force is generated in the electromagnetic coil 79 by turning the nEMOS 7 OFF. This is identical to the cases of the gate drive circuit device 1 of the embodiment 1 and the conventional drive circuit device 9.

In embodiment 2, when the command signal 11a is an OFF-command, a voltage due to the above counter electromotive force is applied to the nEMOS 7 only up to the breakdown voltage of the voltage regulator diode device 72. When the voltage due to the counter electromotive force is applied to the nEMOS 7, the voltage regulator diode 72a, whose breakdown voltage is set to the above value, operates in its breakdown region as long as the applied voltage is sufficient to reach its breakdown voltage. As a result, the nEMOS 7 is turned ON but with its drain-source voltage maintained slightly below its withstand voltage. Thus most of the current $I_{off}$ produced by the electromagnetic energy flows in the nEMOS 7. That is, most of he electromagnetic energy $W_L$ is absorbed in the nEMOS 7. The amount of electromagnetic energy $W_L$ absorption in the full-ON nEMOS 7 of FIG. 3 is remarkably increased compared with the amount absorbed with the half-ON nEMOS 7 in the conventional gate drive circuit device 9 of FIG. 14. Therefore, the time for absorbing the electromagnetic energy $W_L$ the voltage stabilizing means 72 is reduced substantially. The embodiment 2 has the advantage that the current capacity of the voltage regulator diode 72a can be reduced in comparison with the voltage regulator diode 71 in the embodiment 1.

Embodiment 3

Figure 4:
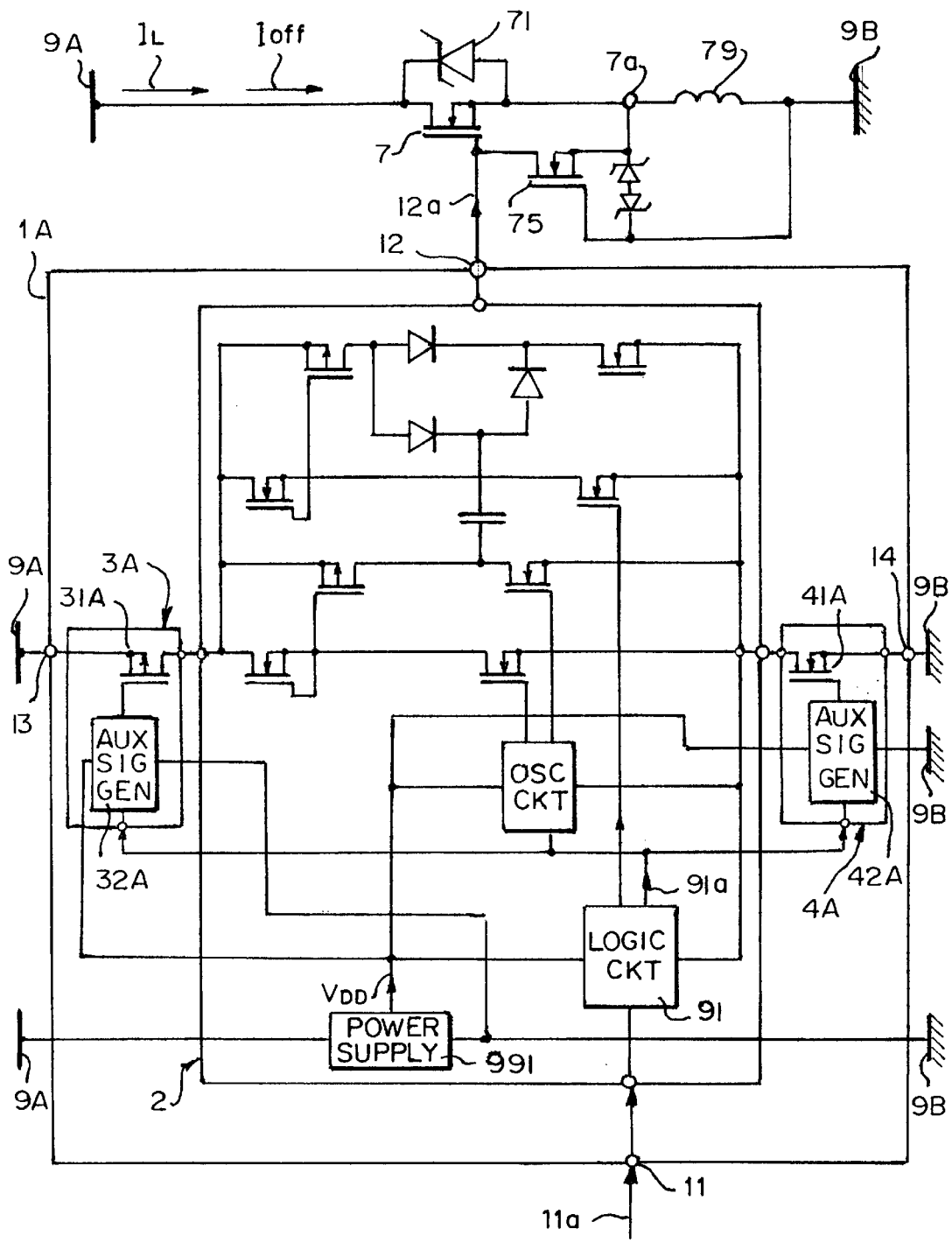
FIG. 4 is a block diagram of still another embodiment of a gate drive circuit device for a voltage-driven semiconductor element according to the present invention.

Referring now to FIG. 4, a third embodiment of a gate drive circuit device 1A includes a power supply side switching means 3A and a reference potential side switching means 4A.

The power source side switching means 3A includes a pEMOS 31A forming a switching device for switching an electric circuit. An auxiliary gate signal generating circuit section 32A in the power supply applies an auxiliary gate signal to the gate of the pEMOS 31A to control its ON/OFF operation. The auxiliary gate signal generating circuit section 32A receives a signal 91a from a logic circuit section 91 in the gate drive signal generating circuit section 2. The signal 91a corresponds to the command signal 11a in prior embodiments. Logic circuit section 91 outputs an auxiliary gate signal "L" when the signal 91a is the ON-command signal and "H" when the signal 91a is the OFF-command signal.

The reference potential side switching means 4A includes an nEMOS 41A forming the switching device for switching the electric circuit. An auxiliary gate signal generating circuit section 42A applies an auxiliary gate signal to the gate of the nEMOS 41A to control its ON/OFF operation. The auxiliary gate signal generating circuit section 42A receives the signal 91a from the logic circuit section 91 in the gate drive signal generating circuit section 2. The logic circuit section 91 responds to the command signal 11a by producing an auxiliary gate signal "H" when the signal 11a is the ON-command signal and "L" when it is the OFF-command signal.

In the embodiment 3, the pEMOS 31A and the nEMOS 41A have withstand voltage higher than the breakdown voltages of the voltage regulator diode 71.

With the above structure of the embodiment shown in FIG. 4, the pEMOS 31A and the nEMOS 41A are turned OFF simultaneously with the nEMOS 7. When the pEMOS 31A and the nEMOS 41A are turned OFF, a voltage due to the counter electromotive force generated at the electromagnetic coil 79 is applied to the pEMOS 31A and the nEMOS 41A simultaneously with the turning OFF of the nEMOS 7. Because the withstand voltages of the pEMOS 31A and the nEMOS 41A are higher than the breakdown voltage of the voltage regulator diode 71, these elements can perform their functions without any difficulty, even in the presence of the voltage due to a counter electromotive force. Therefore, all elements of the gate drive circuit device 1A can be fabricated from electronic circuit parts.

Embodiment 4

Figure 5:
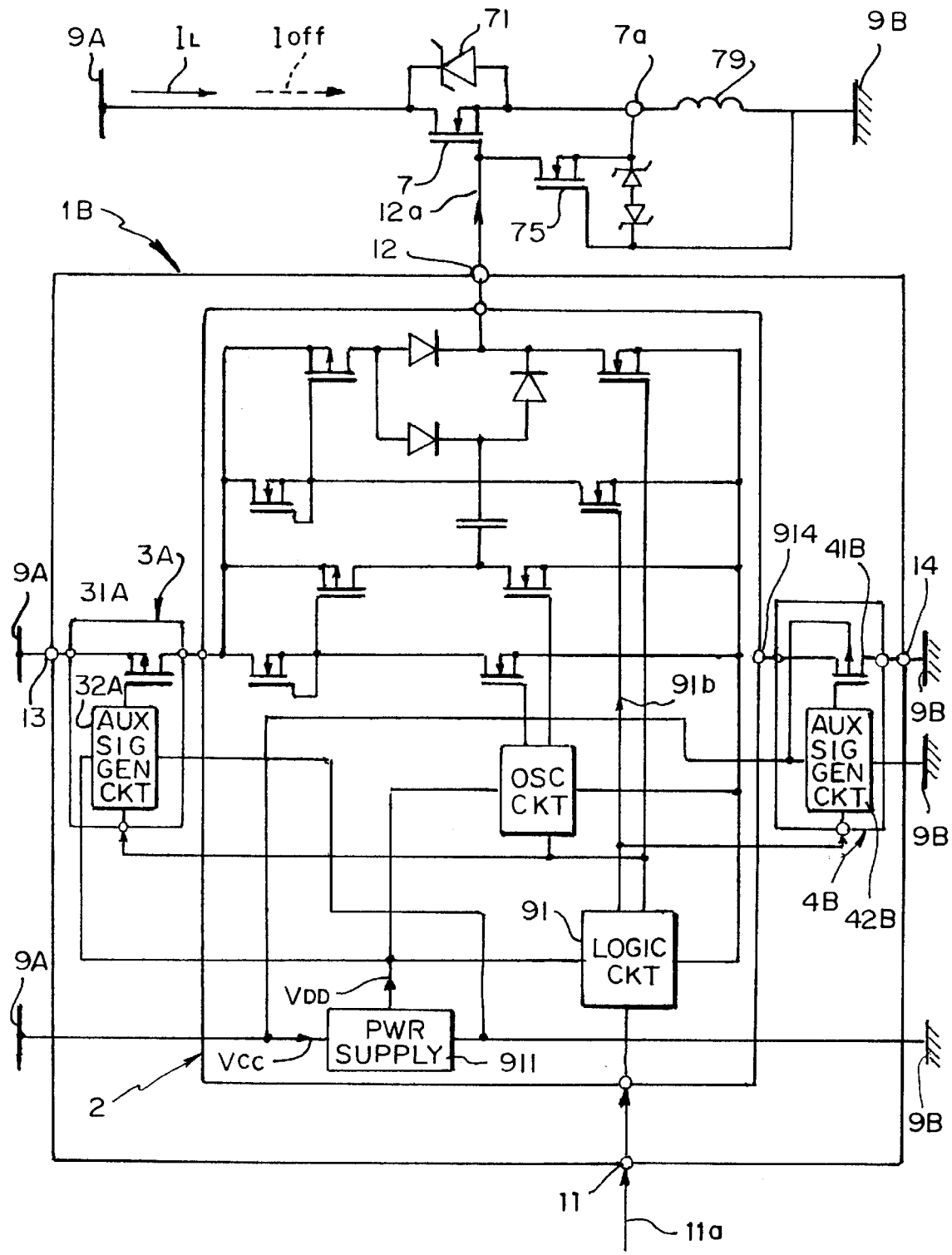
FIG. 5 is a circuit diagram of still another embodiment of a gate drive circuit device for a voltage-driven semiconductor element according to the present invention.
Figure 6:
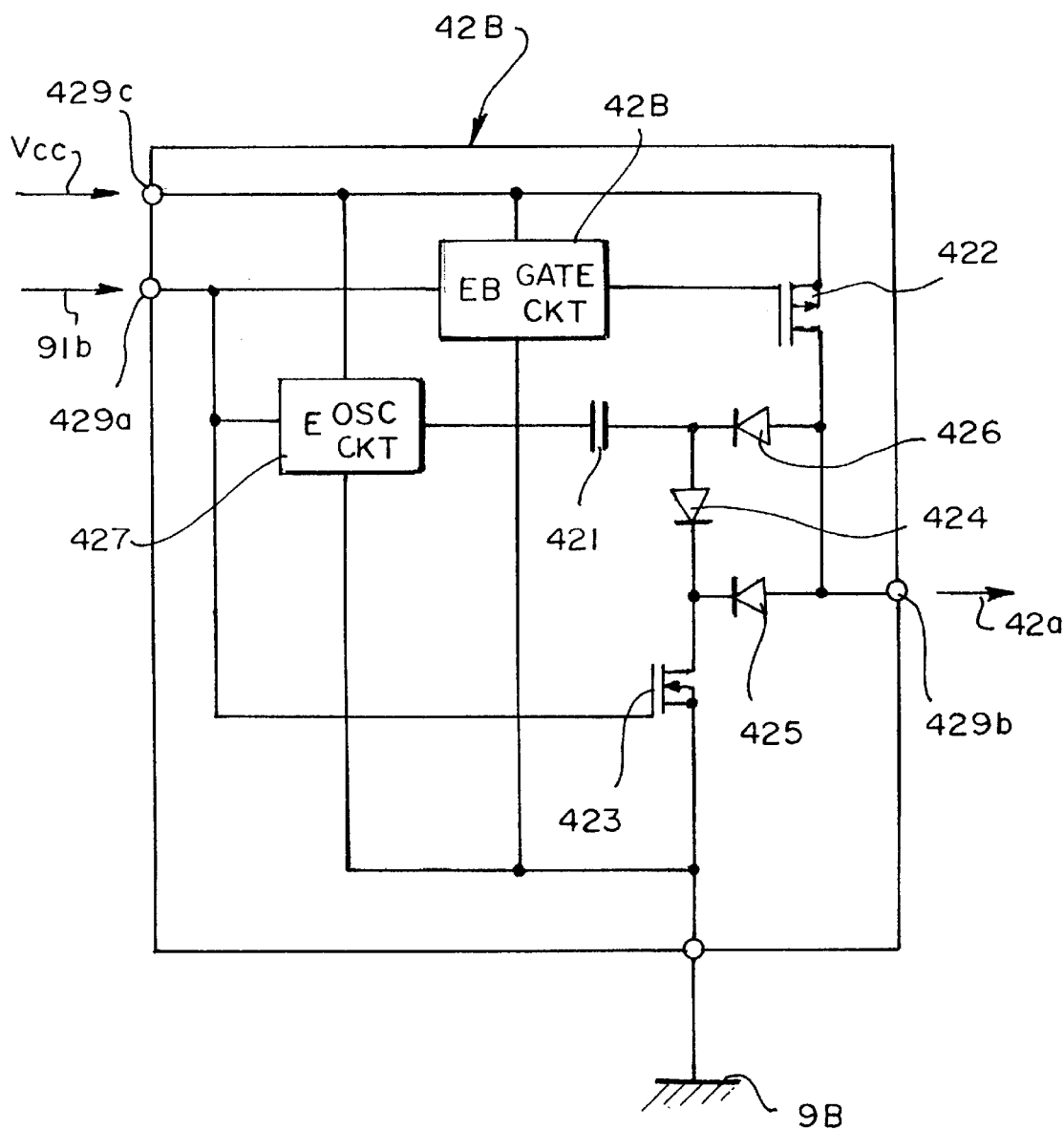
FIG. 6 is a circuit diagram showing the auxiliary gate drive signal generating circuit of FIG. 5.

Referring now to FIGS. 5 and 6, a gate drive circuit device 1B includes a reference potential side switching means 4B instead of the reference potential side switching means 4A in the gate drive circuit device 1A of FIG. 4. The reference potential side switching means 4B includes a pEMOS 41B forming a switching device for switching an electric circuit. An auxiliary gate signal generating circuit section 42B applies an auxiliary gate signal to the gate of the pEMOS 41B to control its ON/OFF operation.

The source of pEMOS 41B is connected to the reference potential terminal 914 in the gate drive signal generator 2. The drain of pEMOS 41B is connected to ground 9B. A back gate of pEMOS 41B is connected to the power supply 9A The gate of the pEMOS 41B receives the auxiliary gate signal 42a output from the auxiliary gate signal generating circuit section 42B.

The auxiliary gate signal generating circuit section 42B receives a signal 91b (EB) from the logic circuit 91 in the gate drive signal generating circuit section 2 at an input terminal 429a. The signal 91b is the inverse of the command signal 11a. Auxiliary gate signal generating circuit section 42B outputs an auxiliary gate signal 42a from an output terminal 429b. Auxiliary gate signal 42a is "L" when the signal 91b is "H", and "H" when the signal 91b is "L".

The auxiliary gate signal generating circuit section 42B includes an oscillating circuit section 427 which receives the signal 91b from an input terminal 419a at one of its inputs and the supply voltage Vcc from a power supply terminal 429c at a second input. A third input of oscillating circuit section 427 is connected to ground 9B. A gate signal circuit section 428 similarly receives the signal 91b, the supply voltage Vcc, and ground at three of its inputs.

A pEMOS 422 receives an output of gate signal circuit section 428 at its gate, and receives the voltage Vcc at its source. The drain of pEMOS 422 is connected to anodes of diodes 424 and 425, and to output terminal 429b from which the signal 42a emerges. The cathode terminal of diode 426 is connected to one terminal of a capacitor 421 and to the anode terminal of a diode 424. The cathode terminal of diode 424 is connected to the cathode terminal of the diode 425, and to the drain of an nEMOS 423. The source of nEMOS 423 is connected to ground 9B and its gate receives the signal 91b.

The output of the oscillating circuit section 427 is connected to the second terminal of the capacitor 421.

When the signal 91b is "H", the oscillating circuit section produces from an output terminal thereof a cyclic rectangular wave alternately repeating the "H" and "L". The cyclic rectangular wave has a period shorter than the shortest duration of the "H" or "L" periods of the command signal 11a. The "H" of the cyclic rectangular wave is, for example, around 5 volts and "L" is substantially equal to the voltage of ground 9B. When the signal 91b is "L", the oscillating circuit section 427 remains quiescent without producing the rectangular wave.

The gate signal circuit section 428 responds to the signal 91b by applying the gate signal to the gate of the pEMOS 422. The gate signal turns the pEMOS 422 OFF when the signal 91b is "H" and turns the pEMOS 422 ON when the signal 91b is "L".

When the signal 91b is "H", the auxiliary gate signal generating circuit section 42B serves as a well-known charging pump that outputs a negative D.C. voltage equal to the D.C. voltage applied across a capacitor. Hence, the auxiliary gate signal 42a switches between "H" or "L" in response to the signal 91b switching between "L" or "H" (accordingly, in correspondence with being "H" or "L" of the command signal 11a). When the auxiliary gate signal 42a is "H", its voltage is equivalent to ground 9B. When the auxiliary gate signal 42a is "L", its voltage is negative with an absolute value substantially equal to the value of the signal "H" from the oscillating circuit section 427, that is, about 5 volts in the example given above.

With the above structure of the embodiment shown in FIG. 5, the pEMOS 41B is used for the voltage-driven semiconductor element forming the reference potential side switching means in contrast to the main semiconductor element nEMOS 7. The back gate of the pEMOS 41B is connected to the power supply 9A which is the highest potential of the gate drive circuit device 1B. As a result, as was described in detail in the section of the above operation, no current path due to a forward-biased p-n junction is formed in the pEMOS 41B even though the gate potential of the nEMOS 7 is reduced below the potential of ground 9B by the counter electromotive force generated by the load inductance of the electromagnetic coil 79. Thus, the pEMOS 41B of the gate drive circuit device 1B can be integrally formed on the same semiconductor substrate that contains the nEMOS 7.

Moreover, in the gate drive circuit device having the composition shown in FIG. 5, the source of the pEMOS 41B is connected to the reference potential terminal 914 in the gate drive signal generator 2, and the drain is connected to ground 9B. The gate of the pEMOS 41B receives the auxiliary gate signal 42a. An "L" level of the auxiliary gate signal 42a for turning the pEMOS 41B ON is a negative voltage having an absolute value equal to the voltage of the signal "H" level output from the oscillating circuit section 427 (for example, −5 volts). Consequently, even though the pEMOS 41B is turned ON and its source potential is reduced to a potential close to ground 9B, the potential of its gate is lower than that of the source. This enables the pEMOS 41B to be held in a sufficiently stable state.

Embodiment 5

Figure 7:
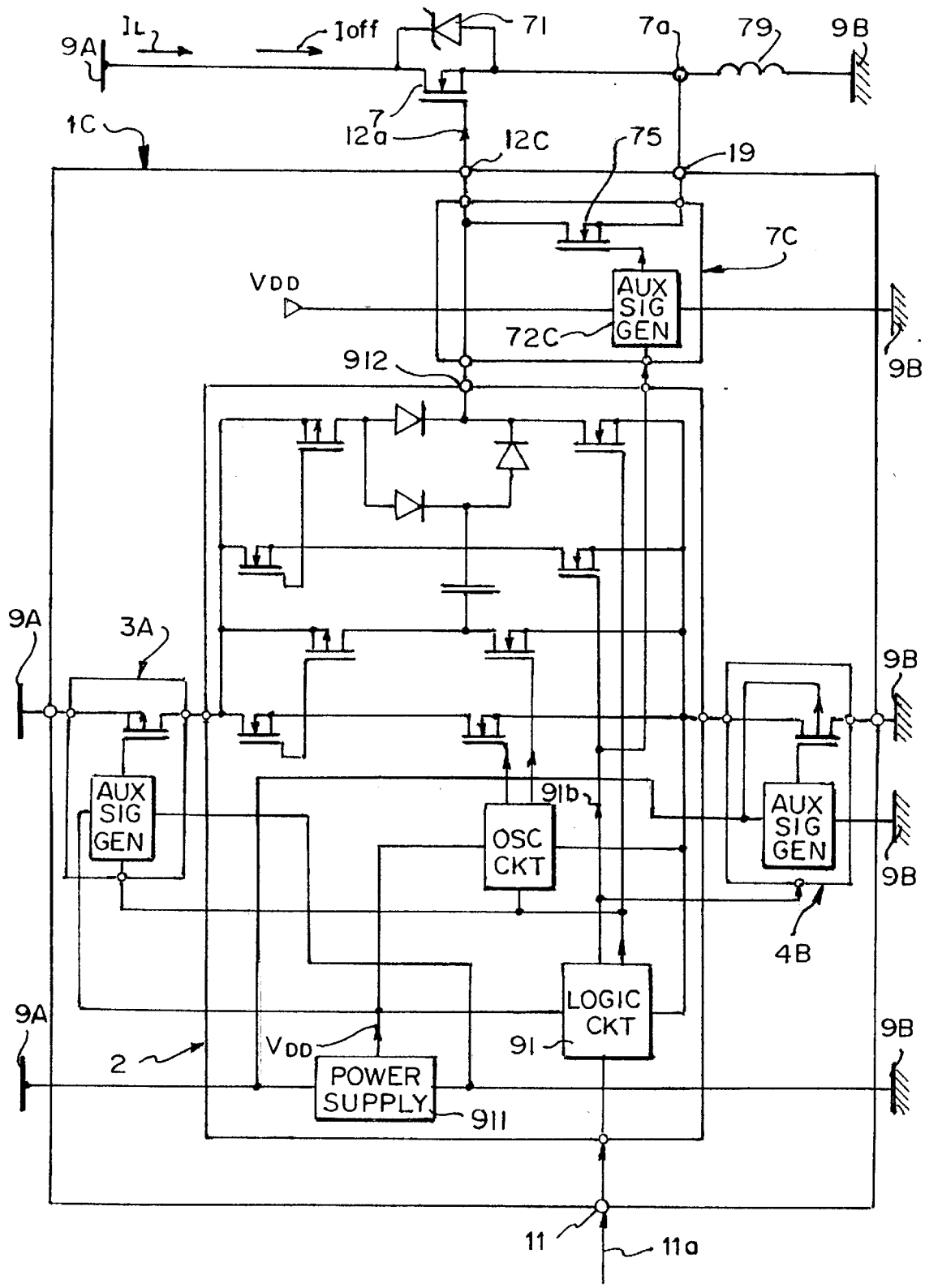
FIG. 7 is a circuit diagram of still another embodiment of a gate drive circuit device for a voltage-driven semiconductor element according to the present invention.

Referring now to FIG. 7, a gate drive circuit 1C includes a switching means 7C controlling a signal 12a fed to an output terminal 12C. The switching means 7C contains an nEMOS 75. The switching means 7C includes an auxiliary gate signal generating circuit section 72C for applying an auxiliary gate signal to the gate of the nEMOS 75. The auxiliary gate signal generating circuit section 72C receives a signal 91b, which is the inverse of the command signal 11a and which is the output from the logic circuit section 91 in the gate drive signal generating circuit section 2. The logic circuit section 9 and outputs an auxiliary gate signal which is "L" when the signal 91b is "H", and "H" when the signal 91b is "L". Hence, in the switching means 7C, when the command signal 11a is an ON-command "L" (signal 91b is "H"), the nEMOS 75 is turned OFF. On the contrary, when the command signal 11a is an OFF-command "H" (the signal 91b is "L"), the nEMOS 75 is turned ON so that the nEMOS 75 short-circuits the output terminal 12C and the terminal 19 of the gate drive circuit device 1C.

The gate of the nEMOS 7 is connected to the output terminal 12C of the gate drive circuit device 1C, and its source is connected to the output terminal 7a and the terminal 19 of the gate drive circuit device 1C. Thus, when the nEMOS 75 is ON, the gate and source of the nEMOS are shorted together, and thus, the nEMOS 7 is turned ON to dissipate counter electromotive energy resulting from the deenergization of the electromagnetic coil 79.

The embodiment of FIG. 7 functions the same as that of the gate drive circuit device 1B of FIG. 5. In this gate drive circuit device 1C, when the command signal 11a is switched from the ON-command to the OFF-command, the gate and source of the nEMOS 7 are short-circuited by the nEMOS 75 in the switching means 7C. Therefore, a breakdown between the gate and source of nEMOS 7 due to the counter electromotive force generated from the electromagnetic coil 79 is prevented by this device. Moreover, in the switching means 7C, the voltage regulator diodes 75a and 75b of prior embodiments between the gate and source of the nEMOS 75 are unnecessary. The voltage regulator diodes 75a and 75b are the elements for bypassing the gate and source of the nEMOS 75 when a counter electromotive force is generated. Accordingly, they must have a current capacity corresponding to a magnitude of the current that flows at the time of generation of the counter electromotive force. Therefore, particularly when forming both the power semiconductor element and its drive circuit on the same semiconductor substrate, downsizing is limited by the area occupied by the voltage regulator diodes 75a and 75b. On the contrary, in the switching means 7C according to this embodiment, avoiding the need for the voltage regulator diodes 75a and 75b enables the semiconductor substrate to be reduced in size.

Embodiment 6

Figure 8:
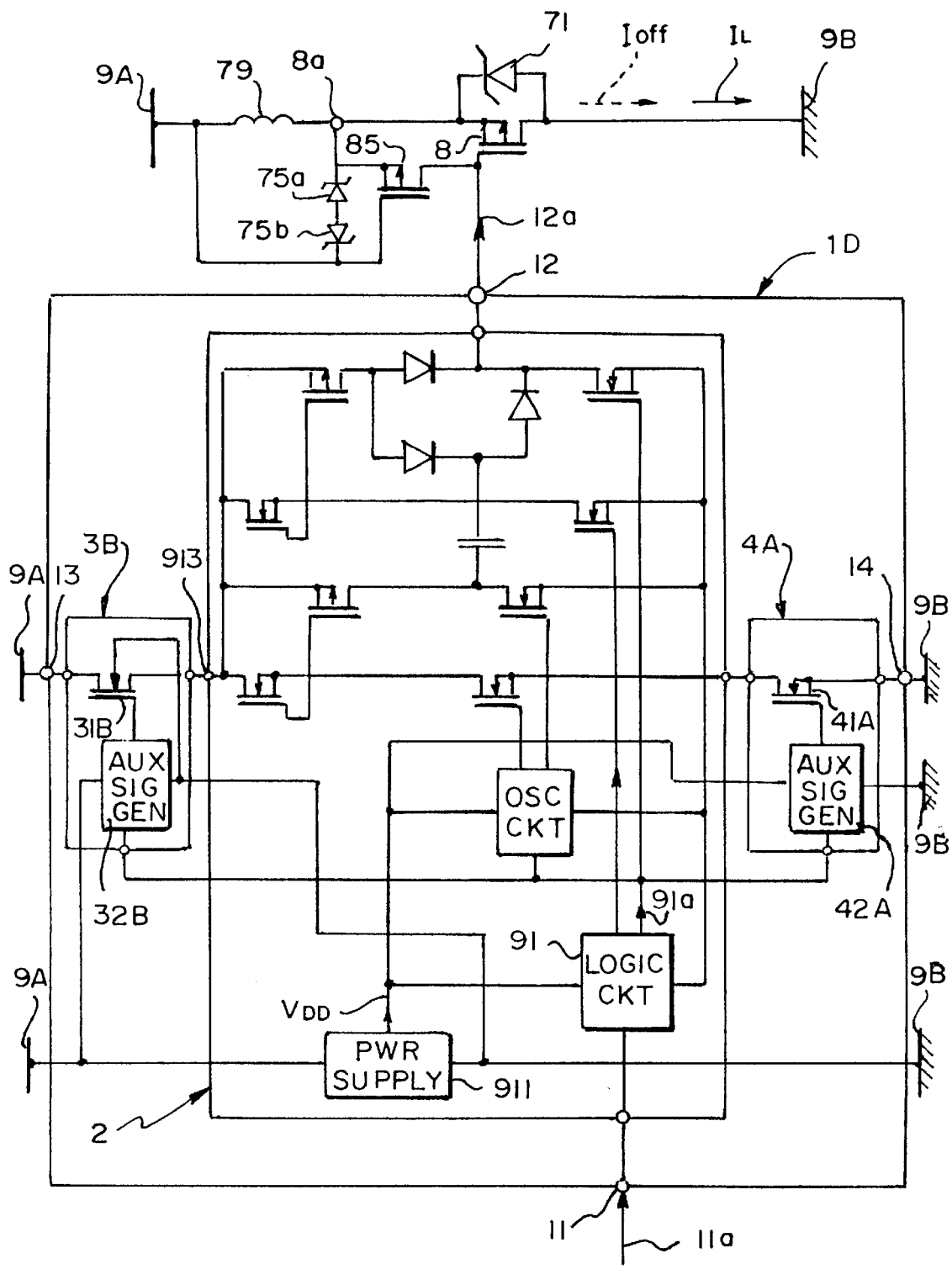
FIG. 8 is a circuit diagram of still another embodiment of a gate drive circuit device for a voltage-driven semiconductor element according to the present invention.

Referring now to FIG. 8, in a still further embodiment of the invention, a gate drive circuit device 1D employs a power supply side switching means 3B instead of the power supply side switching means 3A in the gate drive circuit device 1A of FIG. 4. The power supply side switching means 3B includes an nEMOS 31B forming the switching device for switching the electric circuit. An auxiliary gate signal generating circuit section 32B applies an auxiliary gate signal to the gate of the nEMOS 31B to control its ON/OFF operation.

The nEMOS 31B has its source connected to the power supply terminal 913 in the gate drive signal generator 2. The drain of nEMOS 31B is connected to the power supply 9A. The back gate of nEMOS 31B is connected to ground 9B. The gate of the nEMOS 31b receives an auxiliary gate signal from the auxiliary gate signal generating circuit section 32B. The auxiliary gate signal generating circuit section 32B includes a circuit operating as, for example, a charging pump (not shown). The charging pump receives the signal 91a (E), which corresponds to the command signal 11a, output from the logic circuit section 91 in the gate drive signal generating circuit section 2, and outputs an auxiliary gate signal "H" when the signal 91a is "L", and "L" when the signal 91a is "H". The charging pump in the auxiliary gate signal generating circuit section 32B outputs a voltage substantially twice as high as Vcc which is a power supply voltage of that circuit device. Consequently, the auxiliary gate signal has a voltage substantially twice as high as Vcc during its "H" condition, and substantially equal to that of ground 9B during its "L" condition.

In FIG. 8, the main semiconductor element being controlled is a pEMOS 8 to which the gate drive circuit device 1D supplies the gate drive signal 12a, instead of the nEMOS 7 of the above-described embodiments. Due to the difference between the two types of elements, the connection of the electromagnetic coil 79 as a load for the nEMOS 8 is different. In addition, the connections for short-circuiting the source and drain of the pEMOS 8 when it is turned OFF is different from those of the gate drive circuit devices 1, 1A, 1B and 1C and from the conventional gate drive circuit device 9.

The pEMOS 8 has its drain connected to ground 9B and its source connected to one end of the electromagnetic coil 79 through the output terminal 8a. The pEMOS 85 is also connected between the gate and source of the pEMOS 8. The function of the pEMOS 85, in conjunction with the pEMOS 8, is identical to that of the nEMOS 75 in conjunction with the nEMOS 7 of the above-described embodiments. However, in this case, the potential of the output terminal 8a is higher than the potential of the power supply 9A by an amount equal to the counter electromotive force generated at the electromagnetic coil 79 when the pEMOS 8 is switched from its ON state to its OFF state.

With the above composition of the embodiment shown in FIG. 8, the nEMOS 31B functions as the voltage-driven semiconductor element forming the power supply side switching means for the main semiconductor element pEMOS 8. The back gate of the nEMOS 31B is connected to ground 9B which is in the lowest potential of the gate drive circuit device 1D. As a result, as was described in detail in the section detailing the above operation current path is created by a forward-biased p-n junction in the nEMOS 31B even though the gate potential of the pEMOS 8 is raised higher than the power supply 9A by an applied voltage generated by the counter electromotive force from the electromagnetic coil 79 as a load. This enables, in the gate drive circuit device 1D, forming the nEMOS 31B and the pEMOS 8 integrally on the semiconductor substrate.

Moreover, in the gate drive circuit device having the composition shown in FIG. 8, the nEMOS 31B has its source connected to the power supply terminal 913 in the gate drive signal generator 2, and its drain connected to power supply 9A. Also, a gate of the nEMOS 31B receives the auxiliary gate signal from the auxiliary gate signal circuit section 32B. An "H" level of the auxiliary gate signal for turning the nEMOS 31B ON has about twice the amplitude as supply voltage Vcc. Consequently, even though the nEMOS 31B is turned ON and its source potential is raised to a potential close to that of the power supply 9A, the potential of its gate is higher than its source. This enables the nEMOS 31B to be held in a stable state.

Embodiment 7

Figure 9:
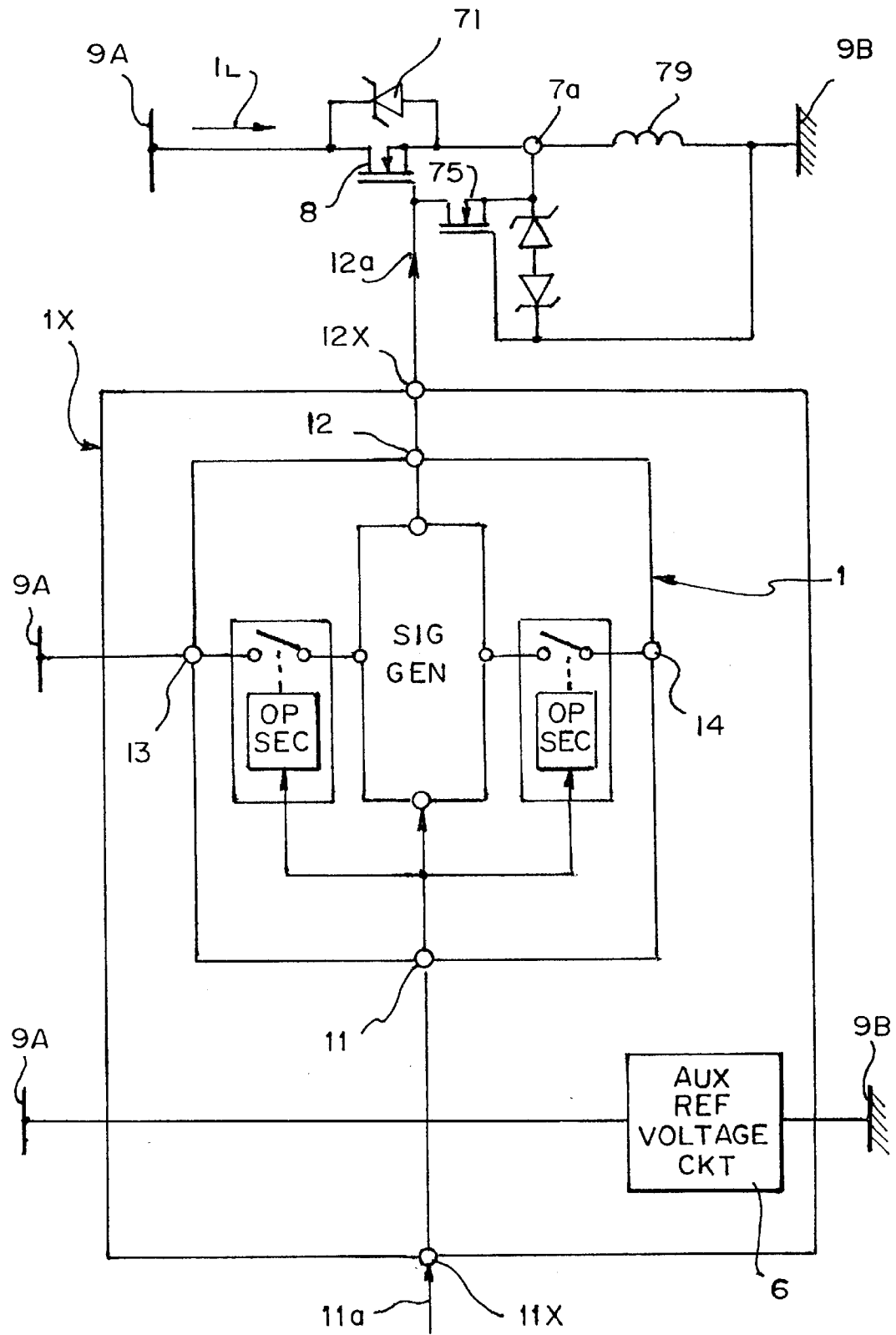
FIG. 9 is a circuit diagram of still another embodiment of a gate drive circuit device for a voltage-driven semiconductor element according to the present invention.
Figure 10:
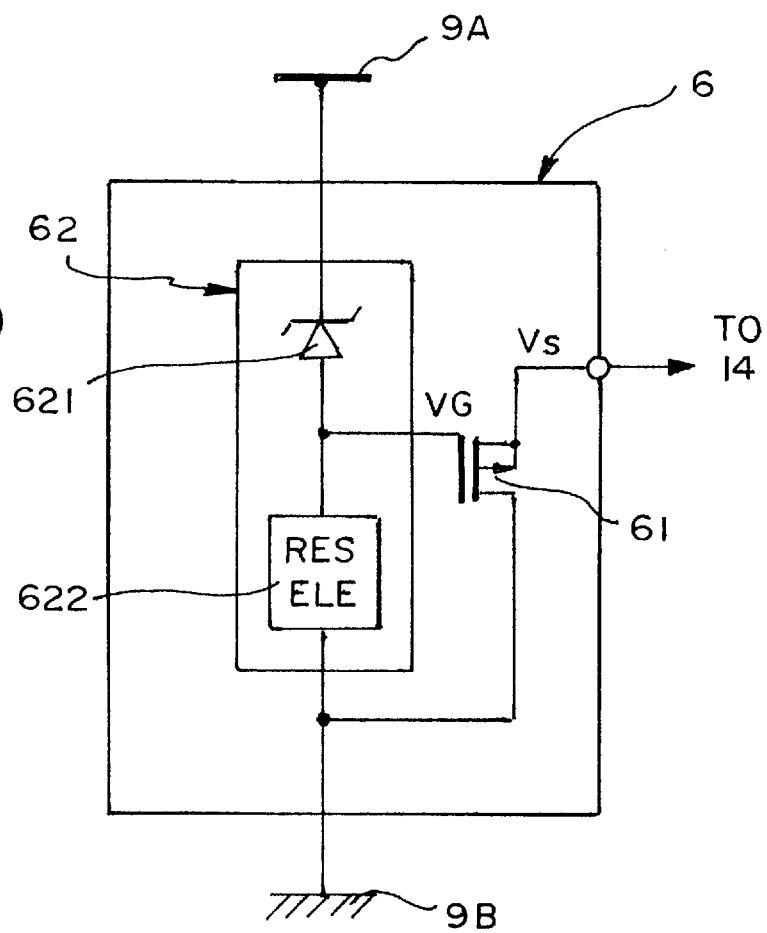
FIG. 10 is a circuit diagram showing the auxiliary reference voltage circuit device of FIG. 9.

Referring now to FIGS. 9 and 10, a gate drive circuit device 1X includes an auxiliary reference voltage circuit device 6 that is added to the gate drive circuit device 1 of FIGS. 1 and 2. The auxiliary reference voltage circuit device 6 (FIG. 10) includes a pEMOS 61 and a constant-voltage circuit device 62 for producing a gate voltage of a substantially constant value to the gate of the pEMOS 61. The constant-voltage circuit device 62 receives the supply voltage Vcc from the power source 9A through a voltage regulator diode. A resistance element 622 is disposed at ground 9B side. The resistance element 622 and power source 9A are connected in series. A node between resistance element 622 and ground 9B is connected to the gate of the pEMOS 61. The pEMOS 61 has a source connected to the reference potential terminal 14 of the gate drive circuit device 1 and a drain connected to ground 9B.

Returning to FIG. 9, an input terminal 11X receives the command signal 11a for gate drive circuit device 1X.

Figure 11:
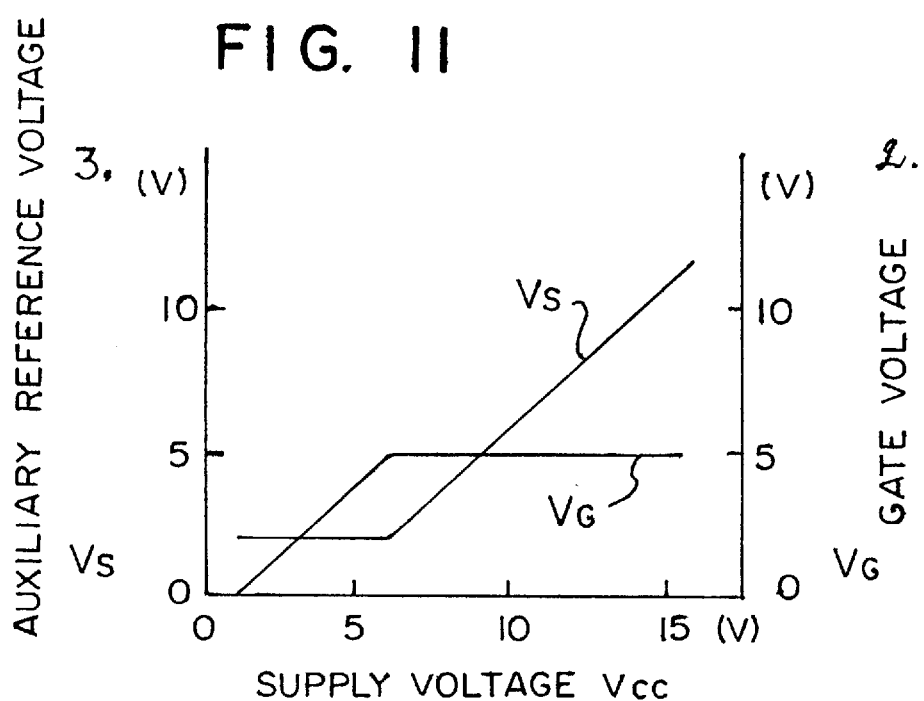
FIG. 11 is a graph showing a dependency of a gate voltage and auxiliary reference voltage on a supply voltage.

With the above composition of the embodiment shown in FIGS. 9 and 10, as was described in the section detailing the operation above, the gate voltage VG applied to the gate of the pEMOS 61 varies with variations in the supply voltage Vcc as shown in FIG. 11. A substantial break in the variation occurs at the breakdown voltage of the voltage regulator diode 621 (approximately 6 volts). The source voltage of the pEMOS 61 driven by its gate voltage VG produces an auxiliary reference voltage Vs. Hence, the auxiliary reference voltage Vs is substantially equal to a voltage difference between the supply voltage Vcc and the gate voltage VG. This produces a voltage between the power supply terminal 13 and ground potential terminal 14 of the gate drive circuit device 1 substantially equal to the gate voltage VG. The gate voltage VG, being equal to the difference between the supply voltage Vcc and the auxiliary reference voltage Vs, is limited to the breakdown voltage of the voltage regulator diode 621.

Embodiment 8

Figure 12:
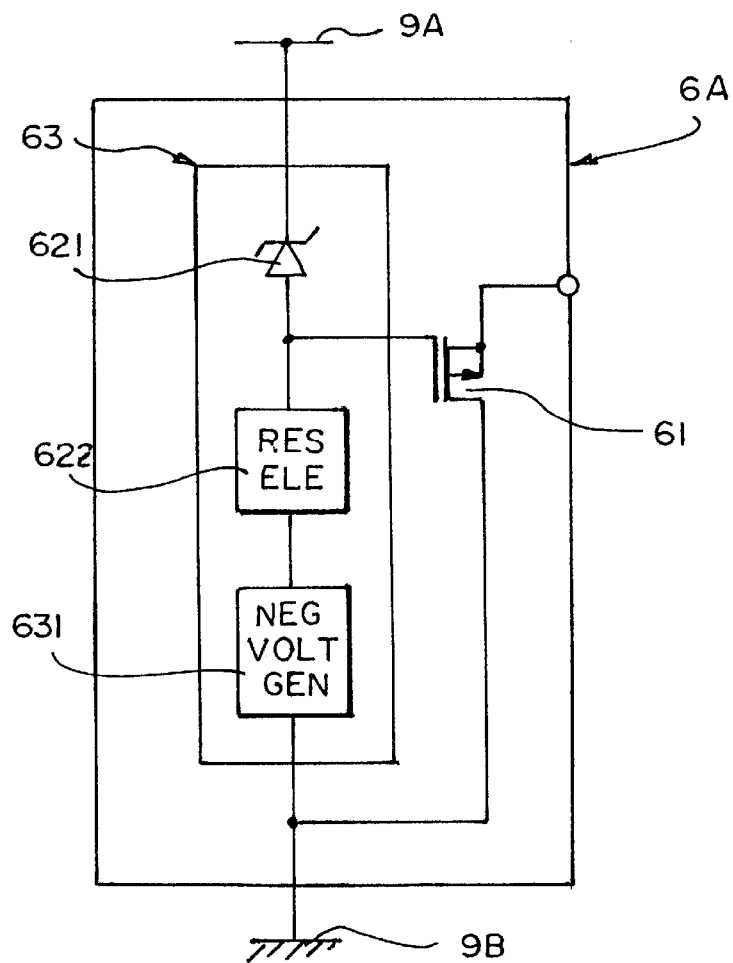
FIG. 12 is a circuit diagram showing an auxiliary reference voltage circuit device applied to still another embodiment of a gate drive circuit device for a voltage-driven semiconductor element according to the present invention.

Referring now to FIG. 12, a circuit device 6A includes a constant-voltage circuit device 63 instead of the constant-voltage circuit device 62 in the auxiliary reference voltage circuit device 6 of FIG. 10. The constant-voltage circuit device 63 differs from the constant-voltage circuit device 62 in that a negative voltage generator 631 is connected between the resistance element 622 and ground 9B.

Figure 13:
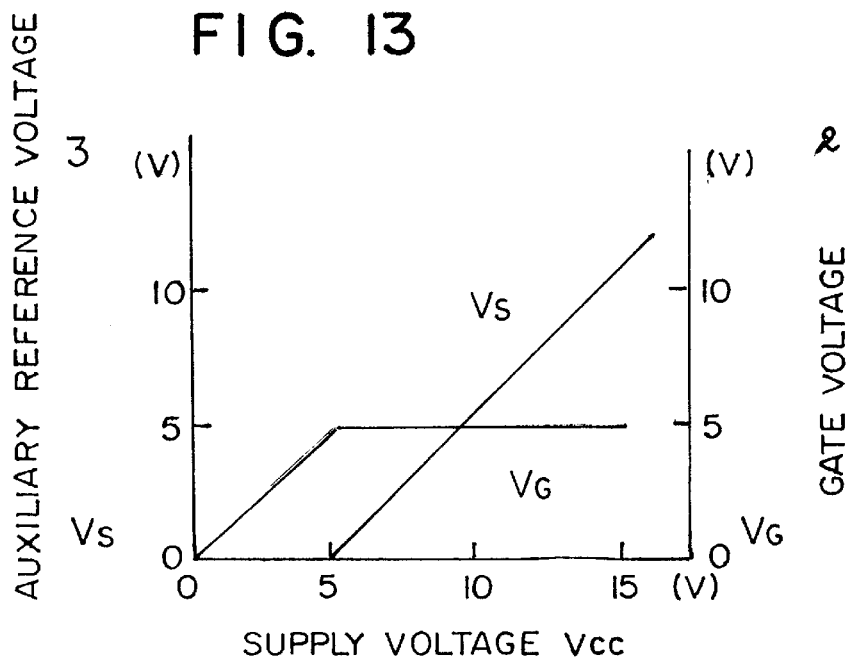
FIG. 13 is a graph showing a dependency of a gate voltage and auxiliary reference voltage on a supply voltage.

Referring now to FIG. 13, the gate voltage VG applied to the gate of the pEMOS 61 varies with variations in the supply voltage Vcc. The variation exhibits a break at a voltage equal to the difference between the breakdown voltage of the voltage regulator diode 621 and the voltage across the negative voltage generator 631. In FIG. 13, it can be observed that a range of the supply voltage Vcc, in which the difference between the supply voltage Vcc and the auxiliary reference voltage Vs is held at a constant value corresponding to the breakdown voltage of the voltage regulator diode 621, is expanded toward a lower voltage range by an amount equal to the voltage generated by the negative voltage generator 631.

In the above description of embodiments 7 and 8, the gate drive circuit device 1X has been described as including the auxiliary reference voltage circuit devices 6 and 6A added to the gate drive circuit device 1. However, it is not limited to this composition and modification is possible so that, for example, the gate drive circuit device 1 may be the gate drive circuit devices 1A to 1D.

With the above structure, the present invention has the following advantages.

(1) The voltage due to the counter electromotive force generated at a load when the power semiconductor element is turned OFF is applied to the power semiconductor element and the voltage stabilizing means by turning both the power supply side switching means and the reference potential side switching means OFF. For this, the operating voltage of the voltage stabilizing means is set to a value slightly lower than the withstand voltage of the power semiconductor element. The voltage stabilizing means or the power semiconductor element is enabled to absorb the increased amount of energy per unit time compared with that of the prior art. Hence, the electromagnetic energy $W_L$ stored in an inductive load is absorbed in a shorter period of time. As a result, the associated electric equipment can operate at a higher speed.

(2) In the above paragraph (1), the power supply side switching means and/or the reference potential switching means include a voltage-driven semiconductor element having a withstand voltage higher than an operating voltage of the voltage stabilizing means for protecting the main voltage-driven semiconductor element from over-voltage. This permits fabricating the entire gate drive circuit device with electronic circuit parts with improved reliability.

(3) In the above paragraph (2), the power supply side switching means or the reference potential side switching means includes a voltage-driven semiconductor element having a channel of a conductivity type different from that of a channel of the main voltage driven semiconductor element. With a reference potential side switching means, the back gate of the voltage-driven semiconductor element is connected to a portion having a potential higher than that of its main electrode connected to the gate drive signal generator side. With a power supply side switching means, the back gate is connected to a portion having a potential lower than that of its main electrode. As a result, current is blocked from flowing in a path that may otherwise form in a forward-biased p-n junction in the voltage-driven semiconductor element forming the switching means even though the gate potential of the main semiconductor element is adversely affected by the counter electromotive force generated at the inductive load at the turn-OFF of the main semiconductor element. Consequently, the voltage-driven semiconductor element forming the switching means can be formed integrally on a semiconductor substrate on which the main voltage-driven semiconductor element is formed. This facilitates inexpensive production of a smaller gate drive circuit device having the advantages described in the above paragraphs (1) and (2).

(4) In the above paragraph (3), an auxiliary gate drive signal generator generates an auxiliary gate drive signal which is in synchronization with a command signal and has a voltage lower than that of the reference potential when the command signal is an ON-command. The voltage-driven semiconductor element of the reference potential side switching means has a gate driven by the auxiliary gate drive signal. One main electrode is connected to the reference potential. The other main electrode is connected to the gate drive signal generator.

In an alternative embodiment, an auxiliary gate drive signal generator produces an auxiliary gate drive signal in synchronization with a command signal. The auxiliary gate drive signal has a voltage higher than that of the power supply when the command signal is an ON-command. The voltage-driven semiconductor element of the power supply side switching means has a gate driven by the auxiliary gate drive signal and one main electrode connected to the power supply. The other main electrode is connected to the gate drive signal generator. With this embodiment, the voltage-driven semiconductor element forming the switching means is held in a sufficiently stable ON-state, so that a voltage drop between the source and drain of these turned-ON semiconductor elements is reduced. As a result, for example, the gate drive circuit device can be used with a reduced supply voltage Vcc.

(5) An auxiliary reference circuit device produces an auxiliary reference voltage that varies in accordance with a variation of the supply voltage such that the power supply of the gate drive signal generator is supplied at a value between the supply voltage of the gate drive circuit device and a voltage from the auxiliary reference circuit device. With this composition, even though the supply voltage varies, a voltage supplied to the gate drive signal generator is regulated to a value equal to or below the breakdown voltage of the voltage regulator diode. As a result, a voltage applied across an electronic part constituting the gate drive signal generator such as, for example, a capacitor in a charging pump, is limited to the breakdown voltage of the voltage regulator diode at the highest. This enables the gate drive circuit device to have a reduced current consumption and an elongated life.

(6) In the above paragraph (5), the constant-voltage circuit device in the auxiliary reference circuit device includes a negative voltage generating circuit device. As a result, a range of the supply voltage, in which the difference between the supply voltage and the auxiliary reference voltage generated from the auxiliary reference circuit device remains substantially constant at a value equal to the breakdown voltage of the voltage regulator diode, range can be expanded toward lower voltages by an amount equal to the voltage generated from the negative voltage generating circuit device. Thus, the advantage described in the above paragraph (5) is available in a wider range of supply voltages.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A gate drive circuit device for a voltage-driven semiconductor element for feeding a gate drive signal to a gate of a main voltage-driven semiconductor element, comprising:
    a first main electrode of said main semiconductor element being connected to one of a power supply and a reference potential;
    a second main electrode of said main semiconductor element is connected to a load;
    a voltage stabilizing means for protecting said main semiconductor element from over-voltage;
    said voltage stabilizing means being connected to said main semiconductor element;
    a gate drive signal generator receiving a command signal for commanding ON/OFF operation of said main semiconductor element;
    means for generating a gate drive signal corresponding to said command signal;
    a power supply side switching means disposed between a power supply and said gate drive signal generator;
    a reference potential side switching means disposed between said gate drive signal generator and the reference potential;
    means for turning ON said power supply side switching means and said reference potential side switching means when said command signal an ON-command and for turning OFF power supply side switching means and said reference potential side switching means when said command signal is an OFF-command.

2. A gate drive circuit device according to claim 1, wherein at least one of said power supply side switching means and said reference potential side switching means includes a voltage-driven semiconductor element having a withstand voltage higher than an operating voltage of said voltage stabilizing means, whereby said main voltage-driven semiconductor element is protected from over-voltage.

3. A gate drive circuit device according to claim 2, wherein:

said reference potential side switching means is a voltage-driven semiconductor element having a channel of a conductive type different from that of a channel of said main voltage-driven semiconductor element; and said voltage-driven semiconductor element of said reference potential side switching means has a back gate connected to a potential higher than that of a main electrode connected to said gate drive signal generator.

4. A gate drive circuit device according to claim 2, further comprising:

an auxiliary gate drive signal generator;

means in said auxiliary gate drive signal generator for outputting an auxiliary gate drive signal in synchronism with said command signal;

said auxiliary gate drive signal having a voltage lower than that of said reference potential when the command signal is ON-command, wherein said voltage-driven semiconductor element of said reference potential side switching means has a gate driven by said auxiliary gate drive signal, one main electrode connected to the reference potential and another main electrode connected to said gate drive signal generator.

5. A gate drive circuit according to claim 2, wherein:

said power supply side switching means is a voltage-driven semiconductor element having a channel of a conductive type different from that of a channel of said main voltage-driven semiconductor element; and said voltage-driven semiconductor element of said reference potential side switching means has a back gate connected to a point having a potential lower than that of a main electrode connected to the gate drive signal generator side.

6. A gate drive circuit device according to claim 2, further comprising:

an auxiliary gate drive signal generator;

means in said auxiliary gate drive signal generator for outputting an auxiliary gate drive signal in synchronism with said command signal and with a voltage higher than that of the power supply when said command signal is and ON-command;

said voltage-driven semiconductor element of said power supply side switching means has a gate driven by said auxiliary gate drive signal;

one main electrode of said voltage-driven semiconductor element being connected to the power supply; and another main electrode of said voltage-driven semiconductor element being connected to said gate drive signal generator.

7. A gate drive circuit device according to claim 1, further comprising:

an auxiliary reference voltage circuit device, said auxiliary reference voltage circuit device including means for producing an auxiliary reference voltage which is an intermediate value between a power supply provided by said power supply and said reference potential;

means for varying said auxiliary reference voltage responsive to variations in said power supply voltage in a manner to maintain a difference between said auxiliary reference voltage and said power supply voltage substantially constant;

said auxiliary reference voltage functioning as a reference voltage for said gate drive signal generator;

said auxiliary reference voltage circuit device including a second voltage-driven semiconductor element and a constant-voltage circuit device;

said constant-voltage circuit device including means for outputting a gate voltage to a gate of said second voltage-driven semiconductor element;

a first main electrode of said second voltage-driven semiconductor element being connected to said reference potential;

a second main electrode of said second voltage-driven semiconductor element producing said auxiliary reference voltage; and said constant-voltage circuit device being connected between said power supply voltage and said reference potential.

8. A gate drive circuit device for a voltage-driven semiconductor element as claimed in claim 7, wherein said constant-voltage circuit device includes a voltage regulator diode and a resistant element in series with each other;

said voltage regulator diode is connected to said power supply;

said resistant element is connected to said reference potential;

said voltage regulator diode and said resistant element being connected together at a node; and said gate voltage is output from said node.

9. A gate drive circuit device for a voltage-driven semiconductor element according to claim 7, wherein:

said constant-voltage circuit device includes a series combination of a voltage regulator diode, a resistant element and a negative voltage generating circuit device;

said voltage regulator diode being connected to said power supply;

said resistant element and said negative voltage generating circuit device being connected in a series circuit between said voltage regulator diode and said reference potential;

said series circuit and said voltage regulator diode being connected at a node; and said gate voltage is a voltage at said node.

* * * * *